United States Patent
Im et al.

(10) Patent No.: US 8,209,527 B2
(45) Date of Patent: Jun. 26, 2012

(54) MEMORY SYSTEM AND MEMORY MANAGEMENT METHOD INCLUDING THE SAME

(75) Inventors: Jeon-Taek Im, Anseong-si (KR);
Young-Min Lee, Suwon-si (KR);
Han-Gu Sohn, Suwon-si (KR);
Jin-Hyoung Kwon, Seongnam-si (KR);
Sung-Jae Byun, Yongin-si (KR);
Yun-Tae Lee, Seoul (KR); Gyoo-Cheol Hwang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 526 days.

(21) Appl. No.: 12/430,722

(22) Filed: Apr. 27, 2009

(65) Prior Publication Data

US 2009/0210691 A1    Aug. 20, 2009

Related U.S. Application Data

(63) Continuation-in-part of application No. 11/553,201, filed on Oct. 26, 2006, now Pat. No. 7,882,344.

(30) Foreign Application Priority Data

Apr. 28, 2008    (KR) .......................... 10-2008-0039417

(51) Int. Cl.
*G06F 15/177*    (2006.01)
(52) U.S. Cl. ............................................... 713/2; 713/1
(58) Field of Classification Search .................. 713/1, 2, 713/100; 711/147, 149, 153
See application file for complete search history.

(56) References Cited

U.S. PATENT DOCUMENTS

| | | | |
|---|---|---|---|
| 4,943,911 A | 7/1990 | Kopp et al. | |
| 5,155,833 A | 10/1992 | Cullison et al. | |
| 5,297,260 A | 3/1994 | Kametani | |
| 6,253,293 B1 | 6/2001 | Rao et al. | |
| 6,438,687 B2 | 8/2002 | Klein | |
| 6,584,560 B1 | 6/2003 | Kroun et al. | |
| 7,032,106 B2 * | 4/2006 | Horanzy et al. | 713/2 |

(Continued)

FOREIGN PATENT DOCUMENTS

DE    3639571 A1    6/1988

(Continued)

OTHER PUBLICATIONS

English Translation of Office Action dated Sep. 22, 2008 issued by the German Patent and Trademark Office.

(Continued)

*Primary Examiner* — Paul Yanchus, III
(74) *Attorney, Agent, or Firm* — F. Chau & Associates, LLC

(57)    ABSTRACT

A booting method of a digital processing having a first processor and a second processor is provided. An interface between the first processor and the outside is stopped. A second processor program code is transmitted to a second memory from a first memory. A second stage loader (SSL) for the first processor is transmitted to a buffer of the second processor from the first memory. A first processor program code is transmitted to the second memory from the first memory under the control of the second processor and an interface between the first processor and the outside is resumed. The first processor program code is downloaded fast into the second memory to decrease booting time of the digital processing system.

18 Claims, 20 Drawing Sheets

U.S. PATENT DOCUMENTS

| | | |
|---|---|---|
| 7,305,544 B2 | 12/2007 | Bulusu et al. |
| 2002/0052959 A1 | 5/2002 | Freitas et al. |
| 2002/0165896 A1* | 11/2002 | Kim ............................ 709/102 |
| 2004/0255111 A1* | 12/2004 | Lim ................................ 713/2 |
| 2005/0038962 A1* | 2/2005 | Lim ............................ 711/118 |
| 2005/0193081 A1 | 9/2005 | Gruber et al. |
| 2005/0204101 A1* | 9/2005 | Fukuzo ........................ 711/149 |

FOREIGN PATENT DOCUMENTS

| | | |
|---|---|---|
| DE | 10-2004-009-497 | 6/2005 |
| JP | 08-161283 | 6/1996 |
| JP | 08-263297 | 10/1996 |
| JP | 2000-242610 | 9/2000 |
| JP | 2001-265600 | 9/2001 |
| JP | 2002-091934 | 3/2002 |
| KR | 1999-0055450 | 7/1999 |
| KR | 1020030008608 | 1/2003 |
| TW | 446909 B | 7/2001 |

OTHER PUBLICATIONS

English Abstract for Publication No. 08-263297.
English Abstract for Publication No. 2001-265600.
English Abstract for Publication No. 1020030008608.
English Abstract for Publication No. 1999-0055450.
English Abstract for Publication No. 2002-091934.
English Abstract for Publication No. 2000-242610.

* cited by examiner

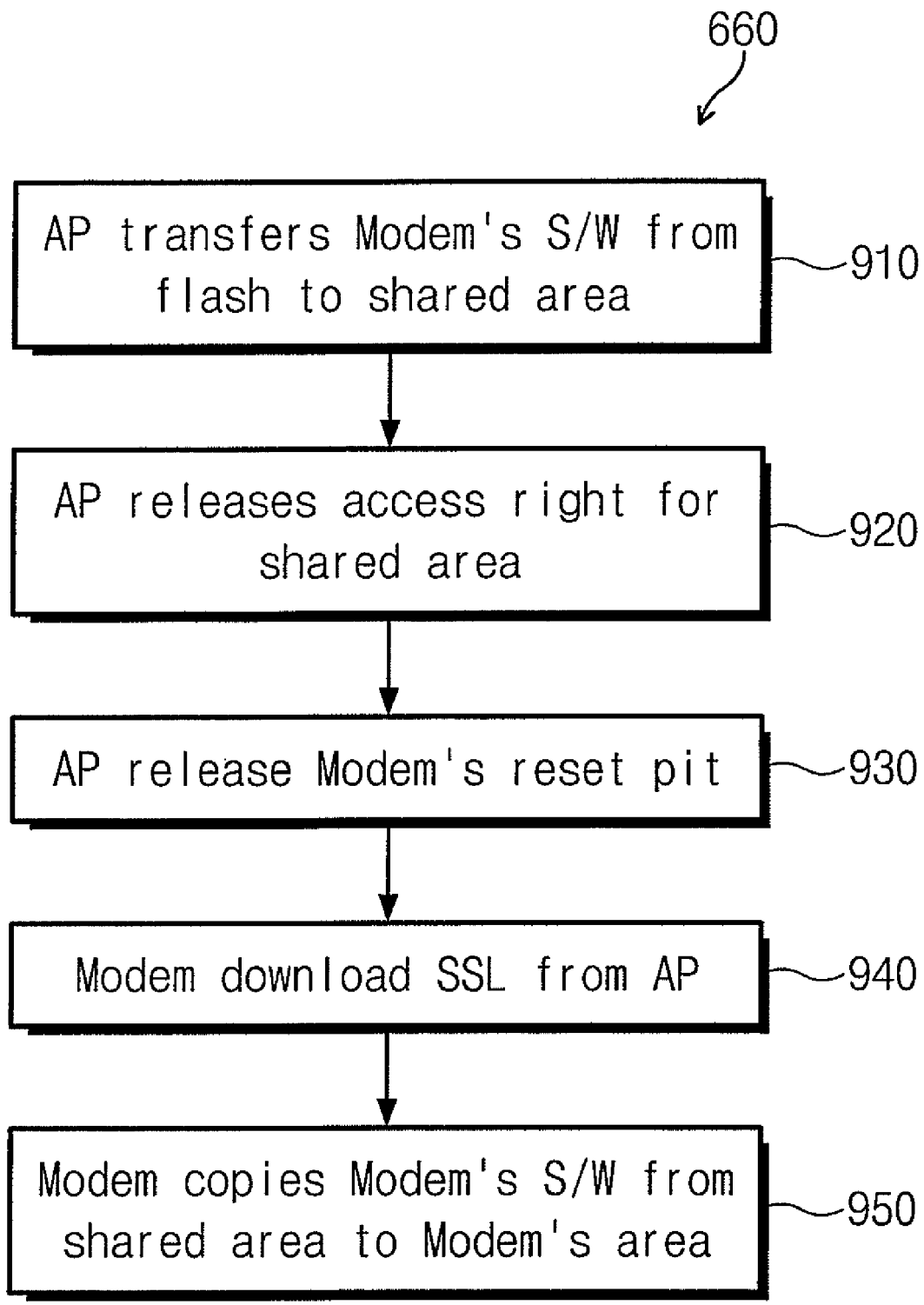

MEMORY SYSTEM AND MEMORY MANAGEMENT METHOD INCLUDING THE SAME

CROSS-REFERENCE TO RELATED APPLICATIONS

This application is a continuation-in-part of U.S. application Ser. No. 11/553,201 filed Oct. 26, 2006 now U.S. Pat. No. 7,882,344, and claims priority to and the benefit of Korean Patent Application No. 10-2008-39417, filed on Apr. 28, 2008, the entire content of which is incorporated by reference herein.

BACKGROUND

1. Technical Field

The present invention relates to a memory system, and more particularly, a memory system and a memory management method including the same that reduces the number of memories therein.

2. Description of Related Art

As the world is moving into the mobile multi-media era, portable multi-media devices incorporate more microprocessors and need larger and faster memory capacity to handle the multi-media data while maintaining the compactness of the devices. For example, a multi-media system may include two or more microprocessors, such as an application processor and a modem.

In general, each microprocessor requires its own non-volatile memories for holding its respective program codes and data, e.g., boot codes, such that program codes and data are not lost when the power supply is unavailable. In addition, each microprocessor requires additional memories for providing processing memory spaces. Such processing memories typically are volatile memories to reduce the manufacture cost.

Thus, the multi-media system generally includes one non-volatile memory and one volatile memory for each microprocessor in the system. In particular, as the number of microprocessors increases, the number of the memories also increases, thereby requiring more platform area and higher power consumption.

FIG. 7 is a schematic diagram illustrating a multiprocessor system according to the related art. As shown in FIG. 7, a multiprocessor system includes at least two processors, such as an application processor ("AP") 1 and a modem processor ("MODEM") 2. Each of the application processor 1 and the modem processor 2 requires a non-volatile memory for holding its respective management information.

In particular, the modem processor 2 is directly connected to a first flash memory 3. In addition, the modem processor 2 is connected to a first volatile memory 4. Further, the application processor 1 is directly connected to a second volatile memory 5 and is connected to a second flash memory 6. The first and second volatile memories 4 and 5 respectively provide processing memory spaces for the application processor 1 and the modem processor 2, and may be one of a mobile DRAM ("MDRAM") an a random-accessible DRAM, such as UtRAM™. The first and second flash memories 3 and 6 respectively hold program codes and data for the application processor 1 and the modem processor 2, and may be one of NOR flash memory, a NAND flash memory and an OneNAND™ flash memory, which takes advantages from high-speed data read function of a NOR flash memory and the advanced data storage function of a NAND flash memory.

FIG. 8 is a schematic diagram illustrating another multi-processor system according to the related art, and FIG. 9 is a schematic diagram illustrating the dual-port memory shown in FIG. 8. As shown in FIG. 8, each of the application processor 1 and the modem processor 2 requires a non-volatile memory for holding its respective program codes and data, e.g., boot codes. In addition, the application processor 1 and the modem processor 2 share a conventional dual-port volatile memory 7, such as dual-port RAM memory.

As shown in FIG. 9, the conventional dual-port volatile memory has a first port PORT1 and a second port PORT2, which may respectively be connected to external devices, such as the application processor 1 and the modem processor 2 (shown in FIG. 15). Memory cells of the dual-port volatile memory 7 are accessible via both the first port PORT1 and the second port PORT2 simultaneously. For example, if a first memory address signal received via the first port PORT1 and a second memory address signal received via the second port PORT2 are the same, that is, is the external devices request to access the same memory cell of the dual-port memory, access collision would occur.

SUMMARY

An exemplary embodiment of the present invention provides a booting method of a digital processing system having a first processor and a second processor. An interface between the first processor and outside of the digital processing system is stopped. A second processor program code is transmitted to a second memory from a first memory. A second stage loader for the first processor is transmitted to a buffer of the second processor from the first memory. A first processor program code is transmitted to the second memory from the first memory under the control of the second processor and an interface between the first processor and the outside is resumed.

The second memory may include a first memory area, a second memory area and a third memory area.

The second memory may be a dual port memory which is accessible to both the first processor and the second processor.

The first memory area may be an area that is for use only by the first processor. The second memory area may be an area that is for use only by the second memory. The third memory area may be an area that is shared by the first processor and the second processor.

The second stage loader may be configured to grant an access right to the third memory area to the first processor in an initial stage.

Resuming the interface may include: resuming the interface between the first processor and the outside under the control of the second processor; downloading the second stage loader into an internal memory of the first processor from a buffer of the second processor; requesting the second memory area to be accessed by the second processor; permitting an access to the third memory area of the second processor by the first processor; transmitting the first processor program code for the first processor to the third memory area by the second processor; granting the access right to the third memory to the first processor; and copying the first processor program code stored in the third memory area to the first memory area by the first processor.

The second memory may include a mailbox that receives the access right to the third memory area.

The second stage loader may be configured to grant an access right to the third memory area to the second processor in an initial stage.

Resuming the interface may include: resuming an interface between the first processor and the outside under the control of the second processor; downloading the second stage loader into an internal memory of the first processor from a buffer of the second processor; transmitting the first processor program code to the third memory area by the second processor; granting the access right to the third memory area to the first processor; and copying the first processor program code stored in the third memory area to the first memory area by the first processor.

The second memory may include a mailbox that receives an access right to the third memory area.

The access right to the third memory area may be granted to the second processor in the initial stage.

Resuming the interface may include: transmitting the first processor program code to the third memory area of the second memory from the first memory under the control of the second processor; granting the access right to the third memory area to the first processor; resuming the interface between the first processor and the outside by the control of the second processor; downloading the second stage loader into an internal memory of the first processor from a buffer of the second processor; and copying the first processor program code stored in the third area of the second memory to the first area by the first processor.

The second memory may include a mail box to receive access right to the second memory area.

The first memory may be a flash memory, and a second memory may be a dual-port dynamic random access memory.

In accordance with an exemplary embodiment of the present invention a digital processing system is provided including a memory, a first processor coupled to the memory, a second processor coupled to the first processor over a communication channel, the first processor and the second processor both being coupled to a shared memory. The second processor is configured to: stop an interface between the first processor and outside of the digital processing system; transmit a second processor program code to the shared memory from the memory; transmit a second stage loader for the first processor to a buffer of the second processor from the first memory; transmit a first processor program code to the shared memory from the memory under control of the second processor; and resume an interface between the first processor and the outside.

The first processor may be a modem. The second processor may be an application processor. The memory may be a flash memory. The shared memory may be a dynamic random access memory. The second processor program code may be operating system code. The first processor program code may be modem program code.

The digital processing system may be a mobile phone, a bidirectional radio communication system, a unidirectional pager, a bidirectional pager, a personal communication system or a portable computer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 12 to 14 are flowcharts illustrating various embodiments of a method for storing a first processor program code in a DRAM, among the booting steps illustrated in FIG. 11.

DETAILED DESCRIPTION OF THE EMBODIMENTS

Reference will now be made in detail to preferred embodiments of the present invention, examples of which are illustrated in the accompanying drawings.

Figure 1A:
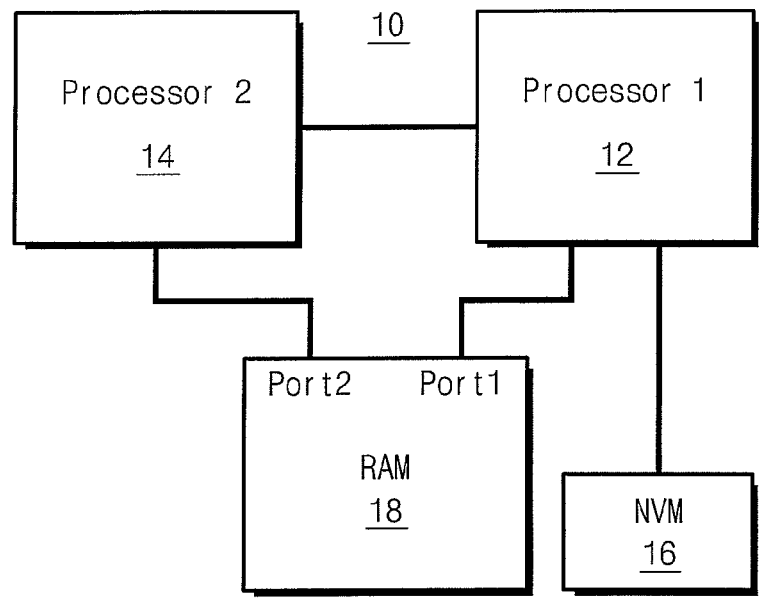
FIG. 1A is a schematic diagram illustrating a memory system according to an embodiment of the present invention.

FIG. 1A is a schematic diagram illustrating a memory system according to an embodiment of the present invention. In FIG. 1A, a multiprocessor system 10 includes a first processor 12, a second processor 14, a first memory 16 and a second memory 18. The first and second processors 12 and 14 are connected to be communicable with each other. In addition, the first processor is connected to the first memory 16, and each of the first and second processors 12 and 14 is connected to the second memory 18 via separate ports.

Figure 1B:
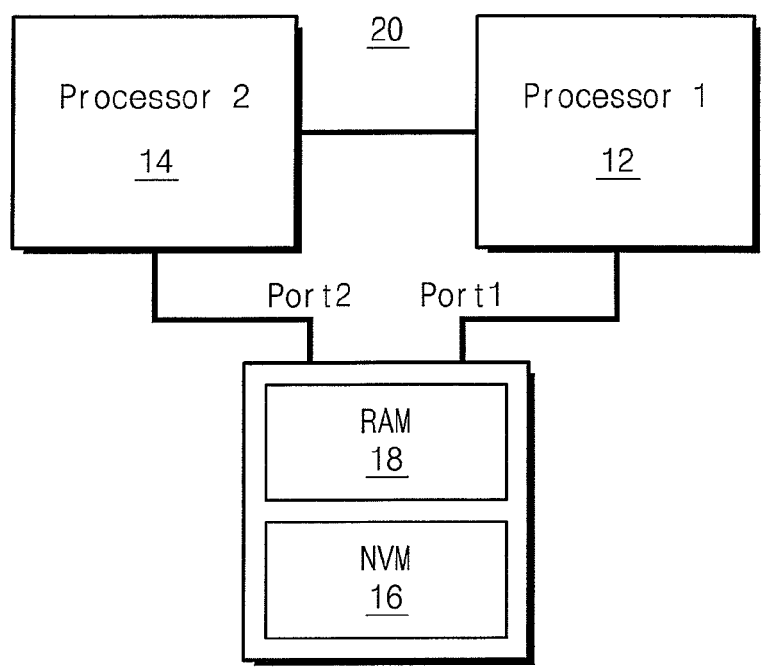
FIG. 1B is a schematic diagram illustrating a memory system according to another embodiment of the present invention.
Figure 1C:
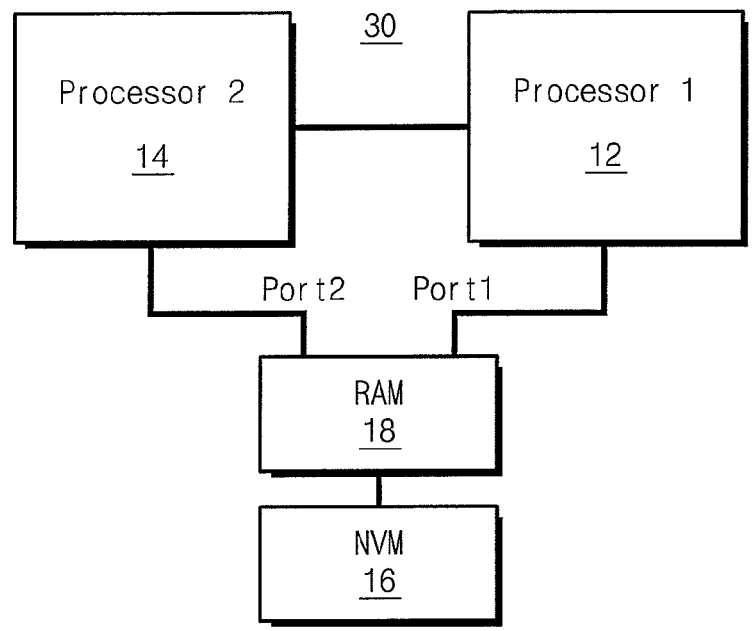
FIG. 1C is a schematic diagram illustrating a memory system according to yet another embodiment of the present invention.
Figure 1D:
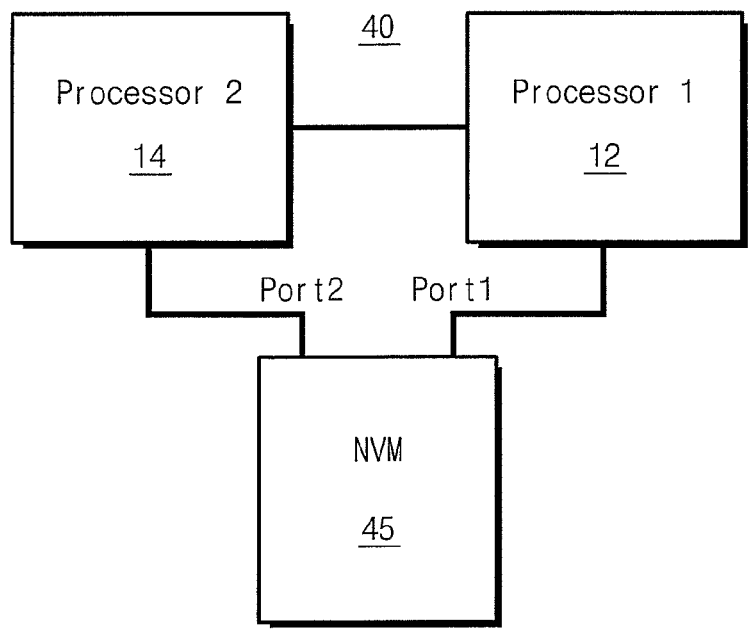
FIG. 1D is a schematic diagram illustrating a memory system according to still another embodiment of the present invention.

FIG. 1B is a schematic diagram illustrating a memory system according to another embodiment of the present invention, FIG. 1C is a schematic diagram illustrating a memory system according to yet another embodiment of the present invention, and FIG. 1D is a schematic diagram illustrating a memory system according to still another embodiment of the present invention. As shown in FIG. 1B, the first and second memories 16 and 18 instead may be formed integrally as a multi-port hybrid chip in a multiprocessor system 20.

Alternatively, as shown in FIG. 1C, the first and second memories 16 and 18 alternatively may be connected to each other in a multiprocessor system 30. Moreover, as shown in FIG. 1D, one dual-port non-volatile memory 45 instead may be incorporated in a multiprocessor system 40, and such a dual-port memory includes memory spaces organized into a plurality of memory banks in a manner that will be described in details below.

The systems 10, 20, 30 and 40 may be a part of a portable device, such as a mobile phone, a portable media player (PMP) and a personal digital assistant (PDA), that include two or more processors. For example, the first processor 12 may be a main application processor for the system, and the second processor 14 may be a modem for the system. The first memory 16 may be a non-volatile memory for holding system management information, such as boot codes for the first and second processors 12 and 14, and the second memory 18 may be a volatile memory for providing processing memory spaces for the first and second processors 12 and 14. Moreover, as shown in FIG. 1D, a dual-port non-volatile memory 45 may be instead incorporated for holding system management information, as well as providing processing memory spaces organized into memory banks.

Figure 2A:
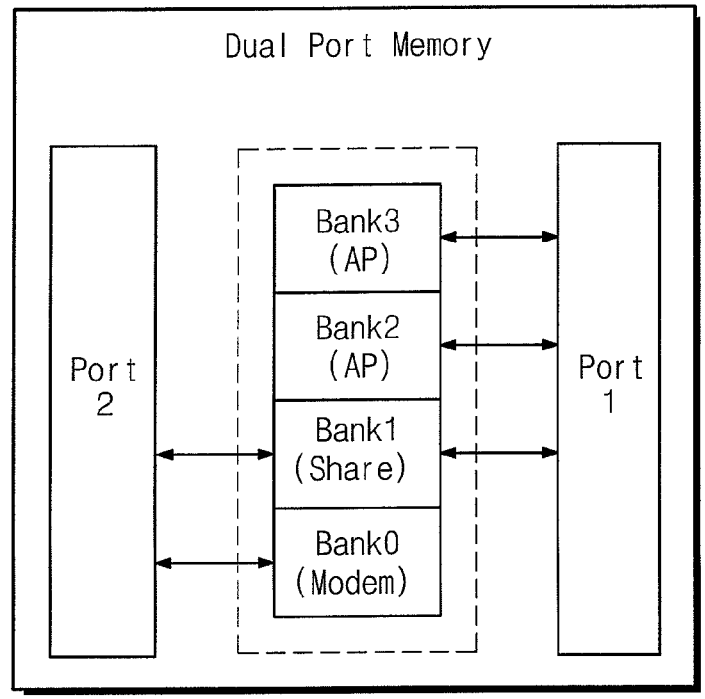
FIGS. 2A to 2C are detailed schematic diagrams respectively illustrating the dual-port memory for the memory system shown in FIGS. 1A to 1C according to different embodiments of the present invention.
Figure 2B:
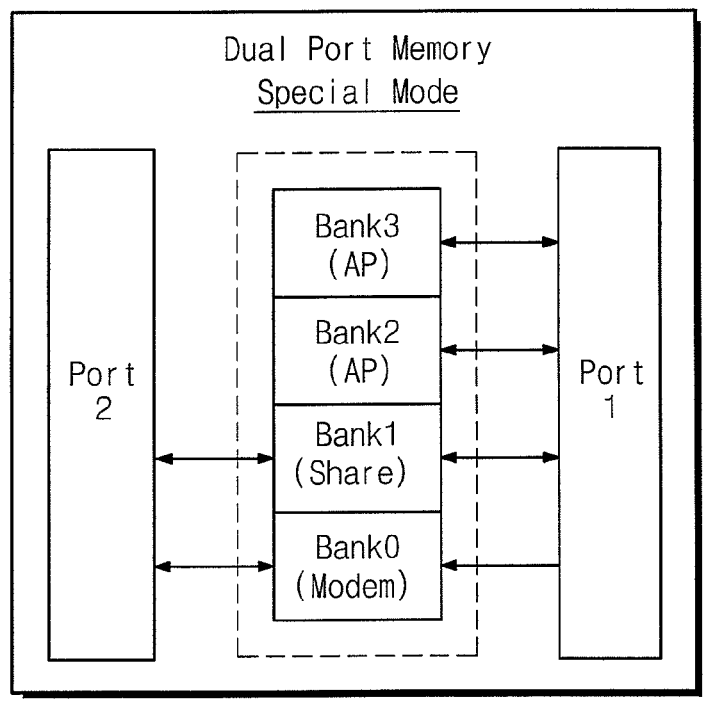
Figure 2C:
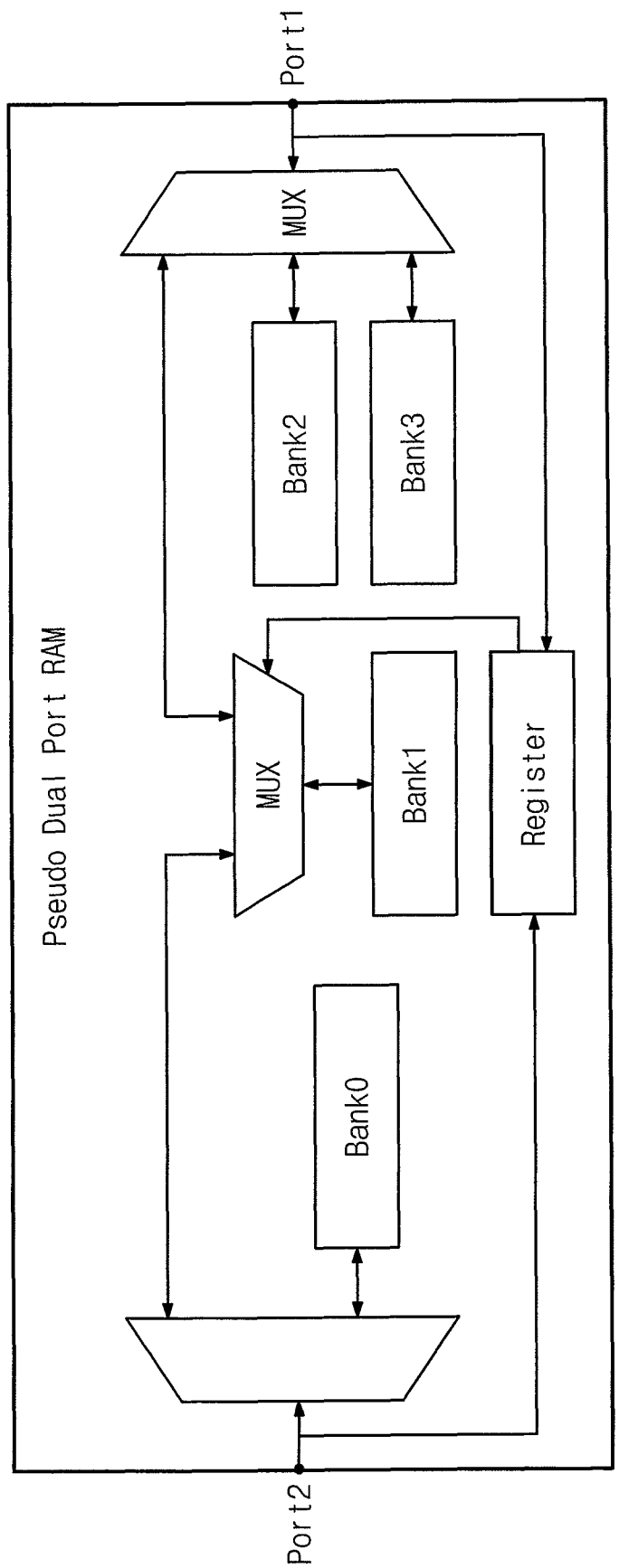

FIGS. 2A to 2C are detailed schematic diagrams respectively illustrating the dual-port memory for the memory system shown in FIGS. 1A to 1C according to different embodiments of the present invention. As shown in FIG. 2A, the dual-port memory includes a plurality of memory spaces organized into a plurality of memory banks, BANK0, BANK1, BANK 2 and BANK3. Each of the memory banks, BANK0, BANK1, BANK2 and BANK3, may be constructed to be potentially accessible by both I/O ports PORT1 and PORT2, but an access right for each of the banks, BANK0, BANK1, BANK 2 and BANK3, is specifically assigned, thereby preventing access collision.

For example, at least one first exclusive bank, BANK 2, is assigned to be accessible exclusively via the first port PORT1, and at least one second exclusive bank, BANK0, is assigned to be accessible exclusively via the second port PORT2. In addition, at least one bank, BANK1, is assigned to be shared by the first and second port PORT1 and PORT2; however, the shared bank BANK1 is assigned to be accessible via one of the first and second ports PORT1 and PORT2 of a given time.

As shown in FIG. 2B, the dual-port memory may have a special operation mode. In a normal mode, the access rights to the banks are as shown in FIG. 2A. In a special mode, a normally exclusive bank may be accessed by another port. For example, in the normal mode, the second exclusive bank BANK0 is assigned to be accessible exclusively via the second port PORT2. In the special mode, the second exclusive bank BANK0 is also accessible via the first port PORT1.

As shown in FIG. 2C, the dual-port memory may further include a plurality of multiplexers MUX for processing data, thereby reducing the number of data I/O ports. The dual-port memory shown in FIGS. 2A to 2C may be a synchronous dynamic random access memory (SDRAM). Alternatively, the dual-port memory may be utilized any suitable volatile memory device, for example, a dynamic random access memory (DRAM), a random access memory (RAM), a read only memory (ROM) and a combination of the foregoing.

Figure 3A:
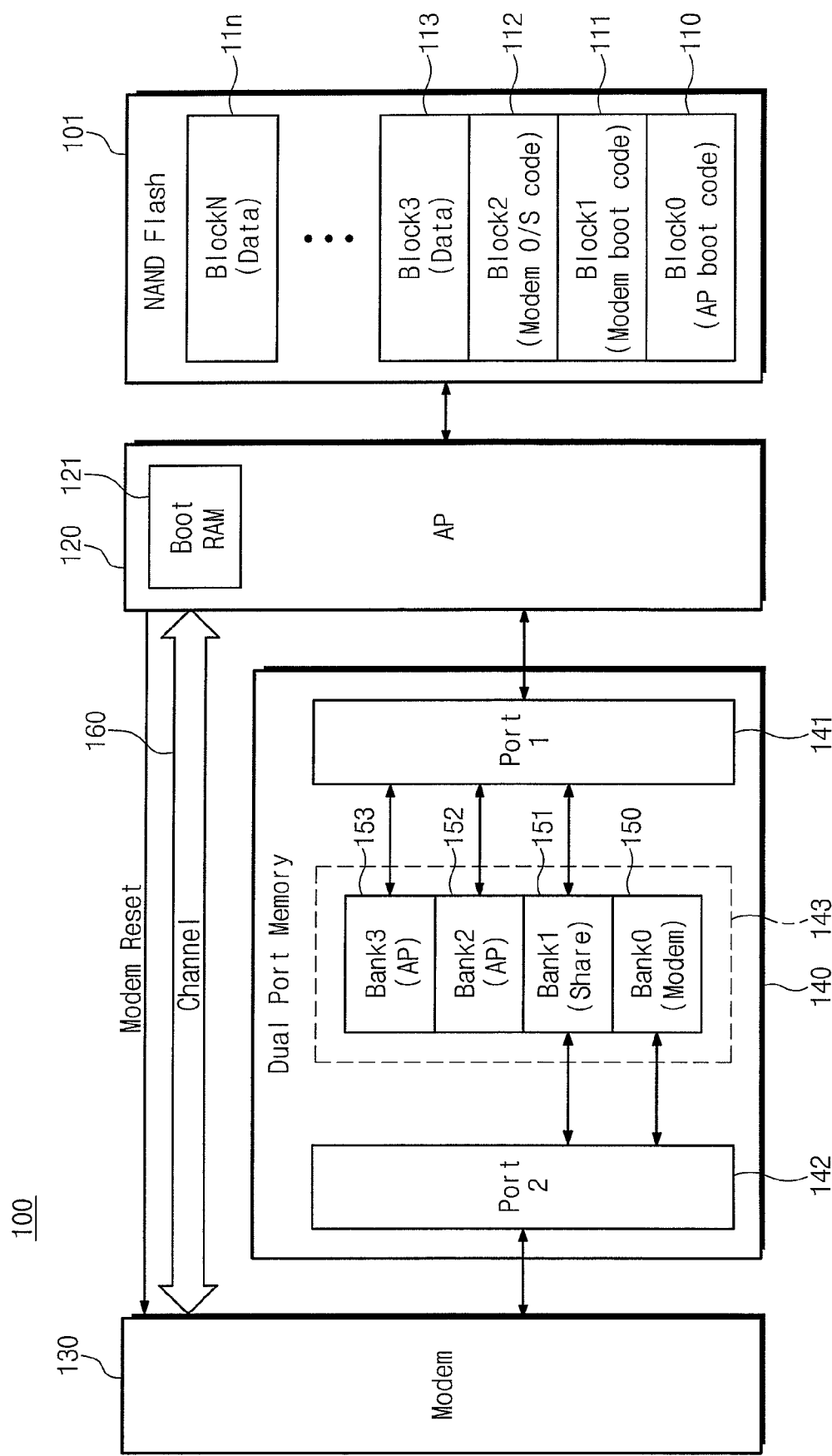
FIG. 3A is a schematic diagram illustrating communication paths of a memory system according to an embodiment of the present invention.
Figure 3B:
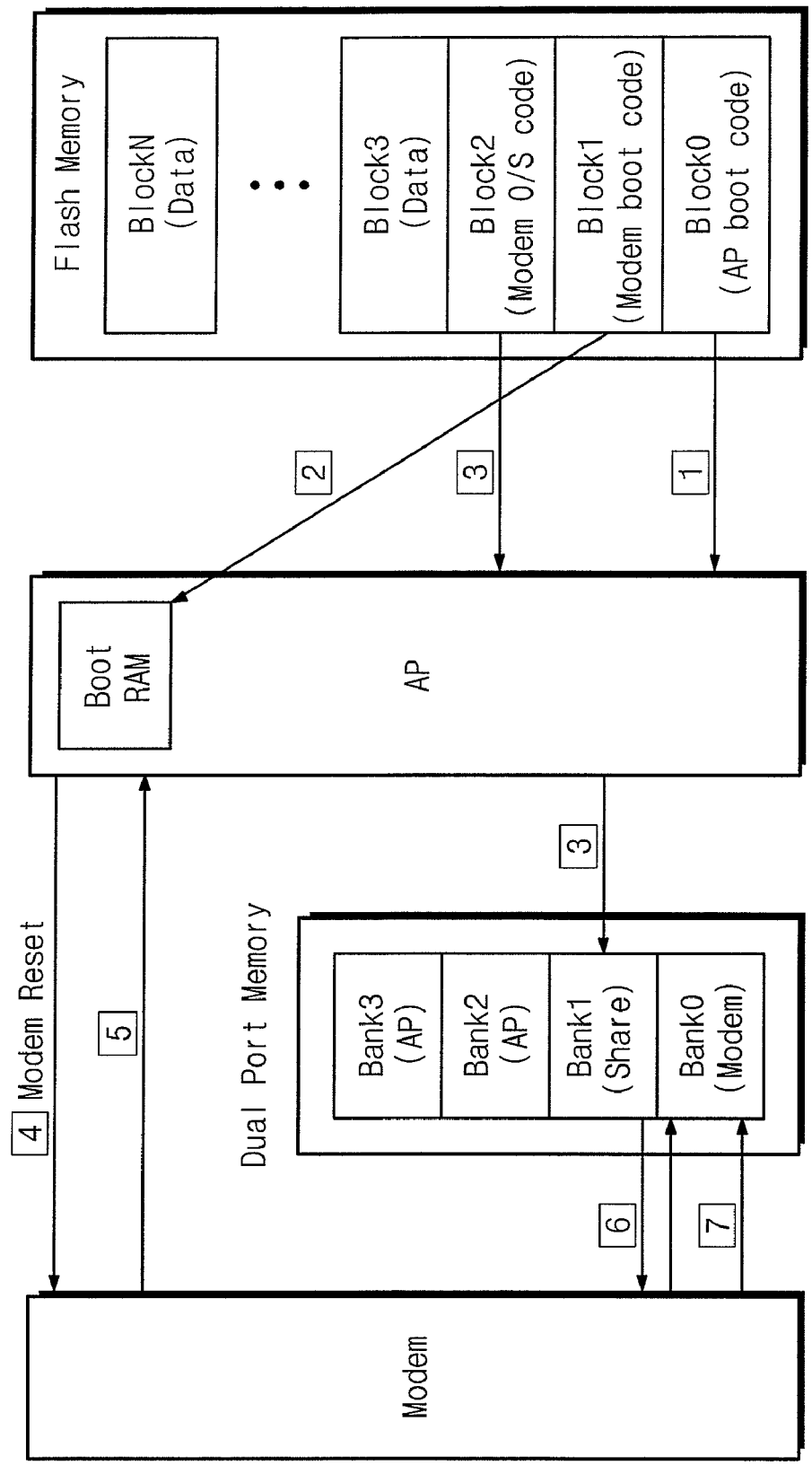
FIG. 3B is a schematic diagram illustrating a start-up communication path in the system shown in FIG. 3A.
Figure 3C:
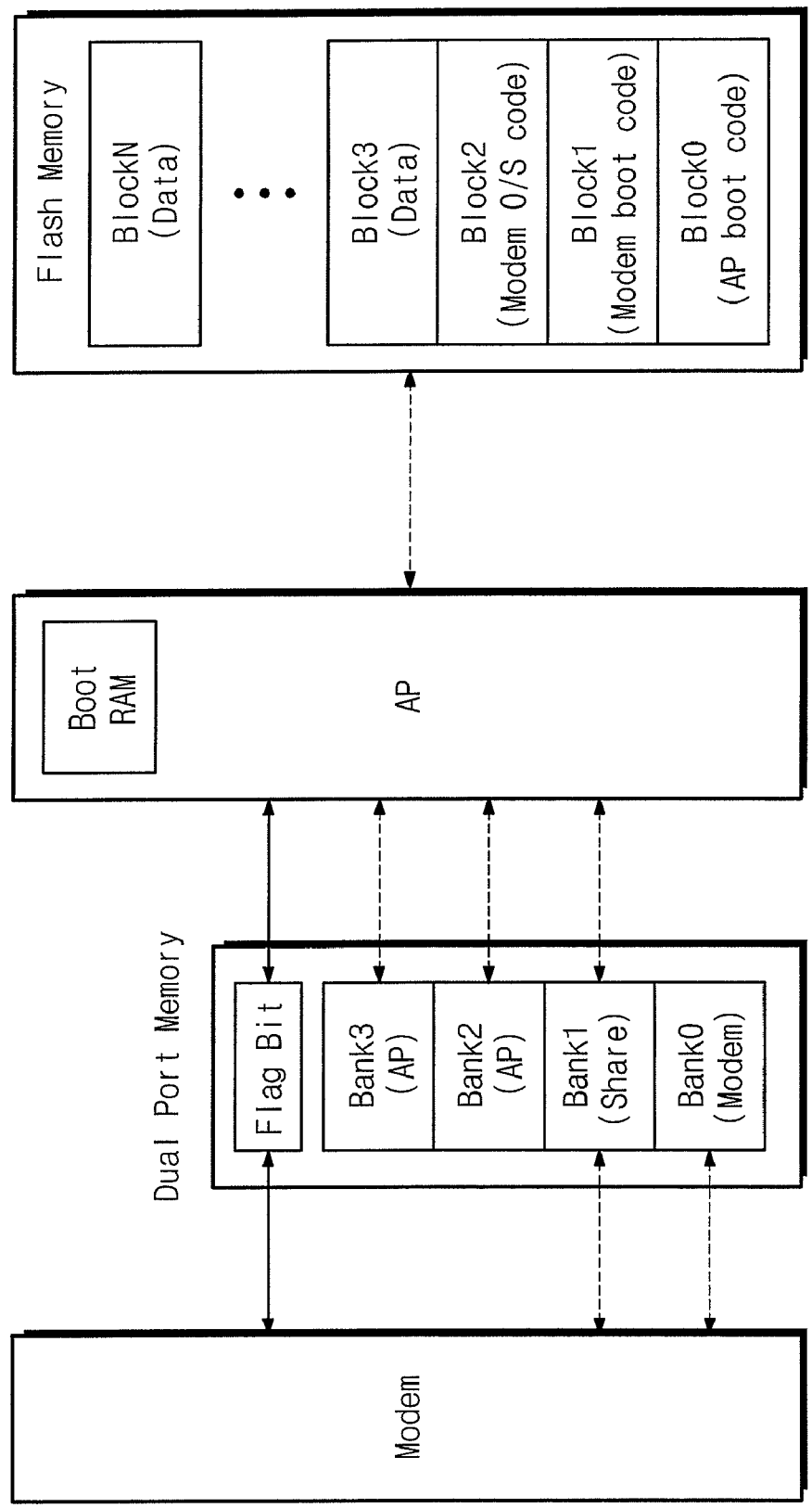
FIG. 3C is a schematic diagram illustrating communication paths in the system shown in FIG. 3A using flag bits according to an embodiment of the present invention.

FIG. 3A is a schematic diagram illustrating communication paths of a memory system according to an embodiment of the present invention, and FIG. 3B is a schematic diagram illustrating a start-up communication path in the system shown in FIG. 3A. In addition, FIG. 3C is a schematic diagram illustrating communication paths in the system shown in FIG. 3A using flag bits according to an embodiment of the present invention.

In FIG. 3A, the system 100 may include a non-volatile memory 101, a first processor 120, a second processor 130, and a dual-port memory 140. The non-volatile memory 101 is connected to the first processor 120. The first and second processors 120 and 130 are connected to each other via a communication channel 160. The communication channel 160 may employ a standardized interface, such as one of SRAM, UART and USB interface, for connecting between the first and second processors 120 and 130.

In addition, each of the first and second processors 120 and 130 is connected to the dual-port memory 140. For example, the first processor 120 is connected to a first port 141 of the dual-port memory 140, and the second processor 130 is connected to a second port 142 of the dual-port memory 140.

The non-volatile memory 101 holds system management information including AP boot code, modem boot code and modem operating software ("O/S") code. In particular, memory cells of the non-volatile memory 101 may be organized into a plurality of blocks 110 ... 11$n$ ($n$ being a positive integer), and each of the blocks 110 ... 11$n$ may store respective system management information. For example, the first memory block 110 may store the AP boot code, the second memory block 111 may store the modem boot code, and the third memory block 112 may store the modem O/S code, and the nth memory block 11$n$ may store system data. The non-volatile memory 101 may be a flash memory.

The dual-port memory 140 provides processing memory spaces to both the first and second processors 120 and 130. In particular, memory cells of the dual-port memory 140 are organized into a plurality of banks 150, 151, 152 and 153. At least one bank, 152 or 153, is assigned to be accessible exclusively via the first port 141. At least one bank 150 is assigned to be accessible exclusively via the second port 142, and at least one bank 151 is assigned to be accessible via both the first and second port 141 and 142.

As illustrated in FIG. 3B, during a start-up operation of the system 100, the first processor 120 is booted in accordance with the AP boot code stored in the non-volatile memory 101. The AP boot code may be stored in the first memory block 110 of the non-volatile memory 101, and the first processor 120 is booted in accordance with the AP boot code by accessing the first memory block 110.

After the first processor 120 is booted, the first processor 120 retrieves start-up information for the second processor 130. For example, the modem boot code may be stored in the second memory block 111 of the non-volatile memory 101, and the modem O/S code may be stored in the third memory block 112 of the non-volatile memory 101. Subsequently, the first processor 120 accesses the second memory block 111 to retrieve the modem boot code and stores the retrieved modem boot code in a RAM memory space 121 of the first processor 120. In addition, the first processor 120 accesses the third memory block 112 to retrieve the modem O/S code and stores the retrieved modem O/S code in the shared bank 151 of the dual-port memory 140.

Prior to storing the retrieved modem O/S code in the dual-port memory 140, the first processor 120 may initialize the entire dual-port memory 140. Upon initialization, the register of the dual-port memory 140 may forward an access flag of the shared bank 151 to the first processor 120. After receiving the access flag, the first processor 120 holds the access right for the shared bank 151 and may then begin writing the retrieved modem O/S code in the shared bank 151 via the first port 141.

Subsequently, the first processor 120 releases a modem reset signal to the second processor 130. The modem reset signal may be released by reset signal or via a communication channel 160 between the first and second processors 120 and 130. The reset signal may include the access flag for the shared bank 151, such that the second processor 130 retains the right to access the shared bank 151 to retrieve the modem O/S code. Alternatively, the access flag may be released separately from the first processor 120 to the second processor 130.

After releasing the modem reset signal, the second processor 130 accesses the RAM memory space 121 of the first processor 120 to retrieve the modem boot code. In addition, the second processor 130 accesses the shared bank 151 to retrieve the modem O/S code via the second port 142. In particular, the second processor 130 copies the modem O/S code from the shared bank 151 to the second exclusive bank 150. After copying the modem O/S code in the second exclusive bank 150, the second processor 130 begins to boot in accordance with the modem boot code and the modem O/S code.

Moreover, during the operation of the system 100, the dual-port memory 140 is accessed by the first and second processors 120 and 130. In particular, the first processor 120 may access the first exclusive bank 152 simultaneously as the second processor 130 accessing the second exclusive bank 150.

In addition, a token is generated for each shared memory bank in the dual-port memory 140. For example, a token and a corresponding pointer for the shared bank 151 may be transmitted among the first and second processors 120 and 130 via the communication channel 160.

Prior to accessing the shared bank 151 in the dual-port memory 140, the first and second processors 120 and 130 verify their possession of the token. For example, in order to write data into the shared bank 151 by the second processor 130, the second processor 130 checks whether the token for the shared bank 151 has been transmitted hereto. If the token for the shared bank 151 has been transmitted to the second processor 130, the second processor 130 then accesses the shared bank 151 to perform the data write operation. After the data write operation, the second processor 130 then releases the token to the first processor 120.

Upon receiving the token, the first processor 120 may then access the shared bank 151. Alternatively or in addition, upon receiving the token, the first processor 120 may copy the data in the shared bank 151 to the first exclusive bank 152 prior to retrieving the data.

Further, during a power-down/sleep operation of one of the first and second processors 120 and 130, the other one of the first and second processors 120 and 130 verifies its possession of the token for the shared bank 151. For example, prior to powering-down the first processor 120, if the token for the shared bank 151 has been transmitted to the second processor 130, then the second processor 130 may forward a confirmation signal to the first processor 120. Upon receiving the confirmation signal, the first processor 120 may initiate a power-down/sleep operation.

However, if the token for the shared bank 151 has not been transmitted to the second processor 130, the second processor 130 instead forward a request for the token to the first processor 120. At about the same time, the second processor 130 starts a timer. If the first processor 120 is still in the operational mode, the first processor 120, upon receiving the request, releases the token for the shared bank 151 to the second processor 130.

However, if the timer expires prior to the token being transmitted to the second processor 130, the system would then assume the operation of the first processor 120 is disrupted or the token has been lost in transmission. As such, upon the expiration of the timer, the second processor 130 then generates a substitute token for the shared bank 151.

In addition, during any time of the operation of the system 100, the request for token may be sent by one of the first and second processors 120 and 130 to the other one of the first and second processors 120 and 130. For example, if the first processor 120 needs to access the shared bank 151 and verifies that it does not possess the token, the first processor 120 may forward the request for token to the second processor 130. Upon receiving the request for token, the second processor 130 may release the token to the first processor 120. If the second processor 130 is accessing the shared bank 151 when receiving the request, the second processor 130 may send an acknowledgement signal to the first processor 120, such that the first processor 120 would not generate a substitute token and waits to receive the token to be transmitted from the second processor 130.

As shown in FIG. 3C, alternatively or in addition, the dual-port memory 140 may include a register having flag bits to track the token for the shared bank 151. For example, each of the first and second processors 120 and 130 may check the flag bits to verify possession of the token and to request for the token. In addition, the register may clear the flag bits automatically after the access of the shared bank 151 is completed. In addition, prior to initiating a power-down/sleep operation, the processor 120 or 130 may complete its access to the shared bank 151 before the register clears the flag bits for the token.

Figure 4A:
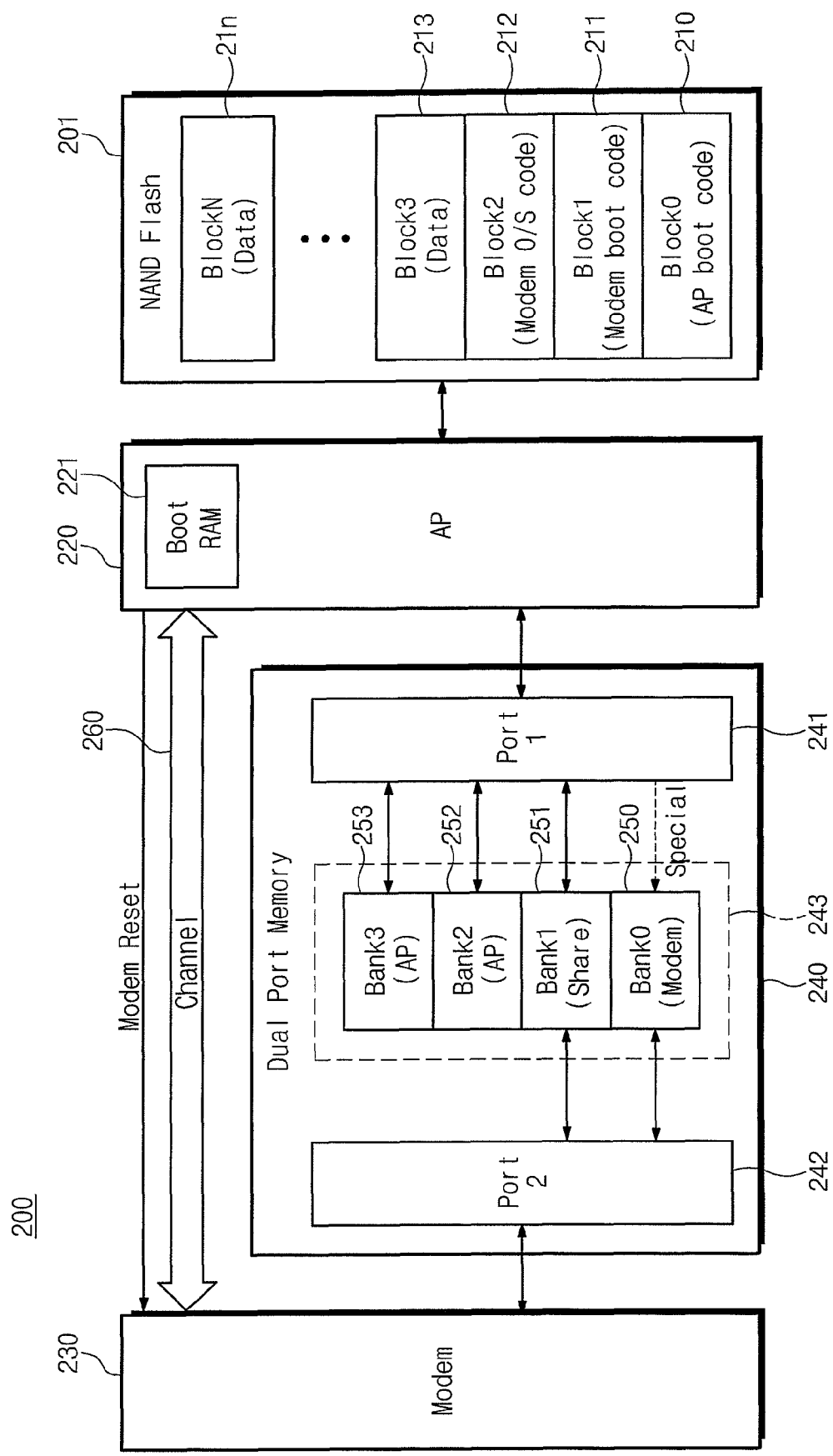
FIG. 4A is a schematic diagram illustrating communication paths of a memory system according to another embodiment of the present invention.
Figure 4B:
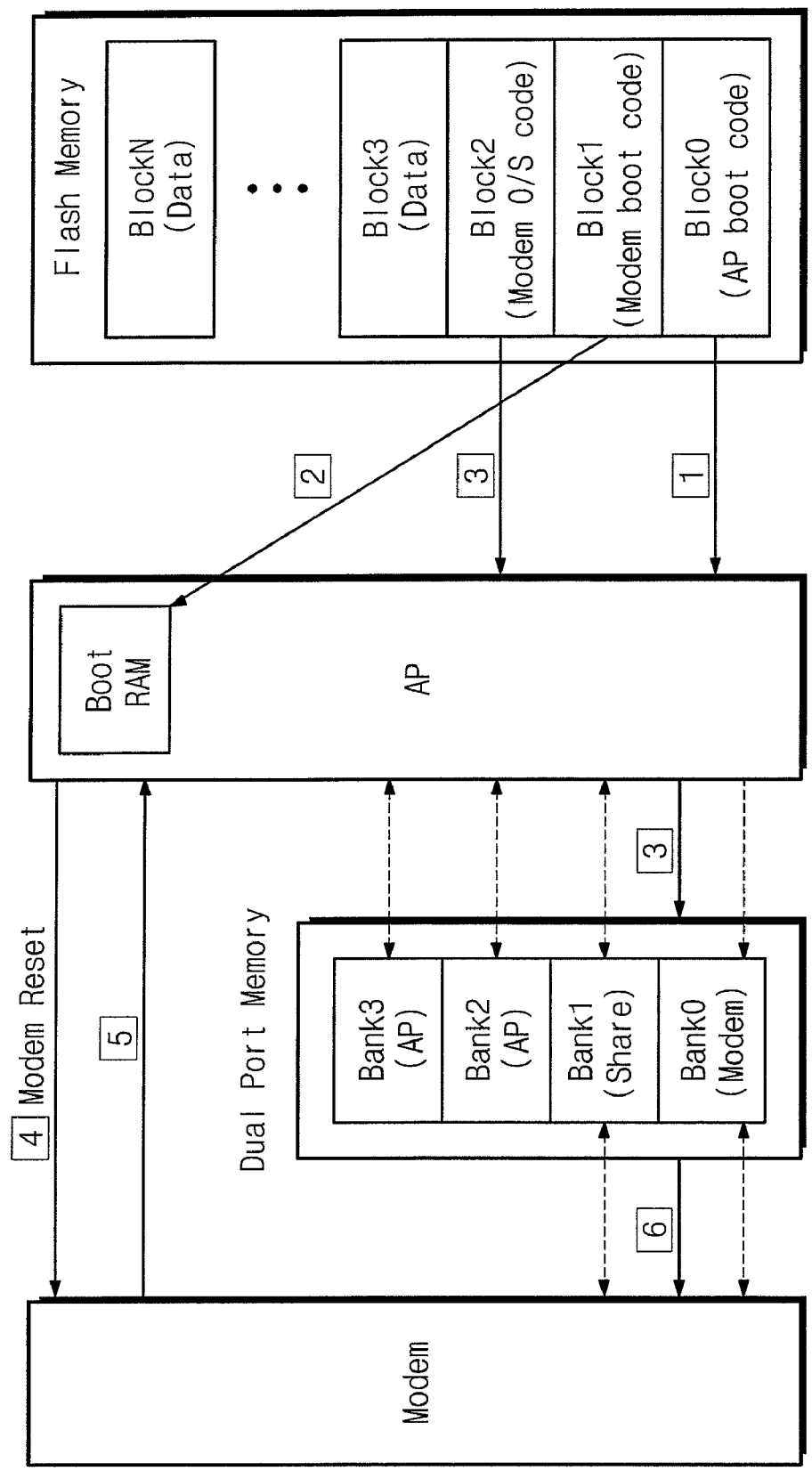
FIG. 4B is a schematic diagram illustrating a start-up communication path in the system shown in FIG. 4A.
Figure 4C:
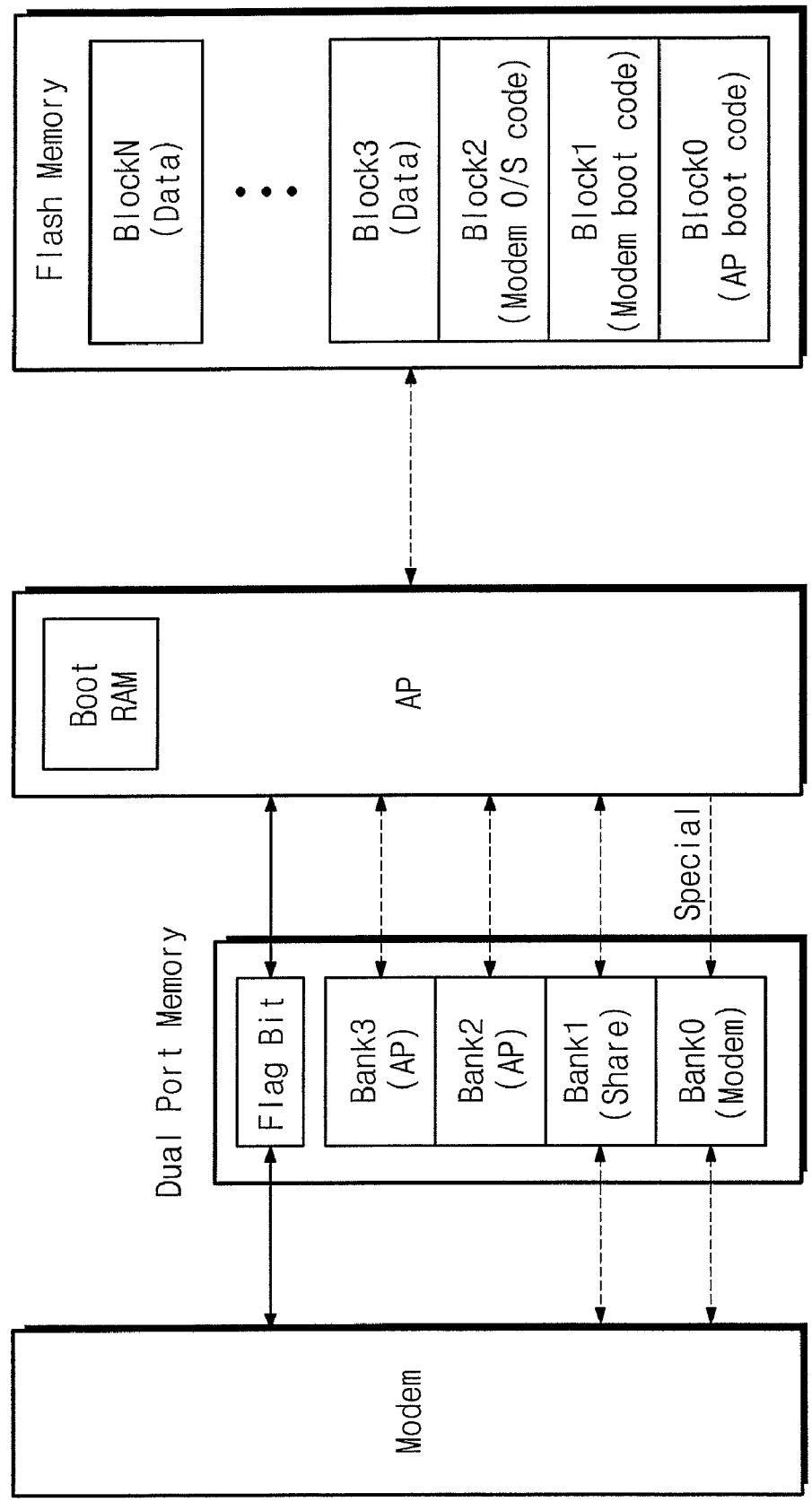
FIG. 4C is a schematic diagram illustrating communication paths in the system shown in FIG. 4A using flag bits according to an exemplary embodiment of the present invention.

FIG. 4A is a schematic diagram illustrating communication paths of a memory system according to another embodiment of the present invention, and FIG. 4B is a schematic diagram illustrating a start-up communication path in the system shown in FIG. 4A. In addition, FIG. 4C is a schematic diagram illustrating communication paths in the system shown in FIG. 4A using flag bits according to another embodiment of the present invention.

In FIG. 4A, the system 200 may include a non-volatile memory 201, a first processor 220, a second processor 230, and a dual-port memory 240. The first and second processors 220 and 230 are connected to each other via a communication channel 260. The communication channel 260 may employ a standardized interface, such as one of SRAM, UART and USB interface, for connecting between the first and second processors 220 and 230.

In addition, the dual-port memory 240 has the special operational mode similar to the memory as shown in FIG. 2B. Further, the non-volatile memory 201 holds system management information including AP boot code, modem boot code and modem O/S code. In particular, memory cells of the non-volatile memory 201 may be organized into a plurality of blocks 210 ... 21*n* (n being a positive integer), and each of the blocks 210 ... 21*n* may store respective system management information. For example, the first memory block 210 may store the AP boot code, the second memory block 211 may store the modem boot code, the third memory block 212 may store the modem O/S code, and the nth memory block 21n may store system date. The non-volatile memory 201 may be a flash memory.

As illustrated in FIG. 4A, during a start-up operation of the system 200, the first processor 220 is booted in accordance with the AP boot code stored in the non-volatile memory 201. The AP boot code may be stored in the first memory block 210 of the non-volatile memory 201, and the first processor 220 is booted in accordance with the AP boot code by accessing the first memory block 210.

After the first processor 220 is booted, the first processor 220 retrieves start-up information for the second processor 230. For example, the modem boot code may be stored in the second memory block 211 of the non-volatile memory 201, and the modem O/S code may be stored in the third memory block 212 of the non-volatile memory 201. As such, the first processor 220 accesses the second memory block 211 to retrieve the modem boot code and stores the retrieved modem boot code in a RAM memory space 221 of the first processor 220. In addition, the first processor 220 accesses the third memory block 212 to retrieve the modem O/S code and stores the retrieved modem O/S code in the dual-port memory 240.

Prior to storing the retrieved modem O/S code in the dual-port memory 240, the first processor 220 may initialize the entire dual-port memory 240. Upon initialization, the dual-port memory 240 is set to the special mode. In the normal mode, the access right for each of the banks of the dual-port memory 240 are shown in solid arrows. In addition, the special mode, a normally exclusive bank may be accessed by an additional port.

For example, in the normal mode, the second exclusive bank 250 is assigned to be accessible exclusively via the second port 242, and in the special mode, the second exclusive bank 250 is also accessible via the first port 241 as shown in the dashed arrow. In the special mode, the register of the dual-port memory 240 may forward a special access flag of the second exclusive bank 250 to the first processor 220. After receiving the special access flag, the first processor 220 holds the special access right for the second exclusive bank 250 and may directly write the retrieved modem O/S code in the second exclusive bank 250 via the first port 241. After writing the modem O/S code in the second exclusive bank 250 by the first processor 220, the first processor 20 releases the special access flag to the dual-port memory 240 and the dual-port memory 240 is set to the normal mode.

In addition, the first processor 220 releases a modem reset signal to the second processor 230. The modem reset signal may be released by reset signal or via the communication channel 260 between the first and second processors 220 and 230.

After receiving the modem reset signal, the second processor 230 accesses the RAM memory space 221 of the first processor 220 to retrieve the modem boot code. In addition, the second processor 230 accesses the second exclusive bank 250 to retrieve the modem O/S code via the second port 242. Subsequently, the second processor 230 begins to boot in accordance with the modem boot code and the modem O/S code.

Moreover, during the operation of the system 200, the dual-port memory 240 is accessed by the first and second processors 220 and 230. In particular, the first processor 220 may access the first exclusive bank 252 simultaneously as the second processor 230 accessing the second exclusive bank 250.

In addition, a token is generated for each shared memory bank in the dual-port memory 240. For example, a token and a corresponding pointer for the shared bank 251 may be transmitted among the first and second processors 220 and 230 via the communication channel 260. Alternatively, the token and the pointer may be transmitted via a register (not shown) of the dual-port memory 240.

Prior to accessing the shared bank 251 in the dual-port memory 240, the first and second processors 220 and 230 verify their possession of the token. For example, in order to write data into the shared bank 251 by the second processor 230, the second processor 230 checks whether the token for the shared bank 251 has been transmitted hereto. If the token for the shared bank 251 has been transmitted to the second processor 230, the second processor 230 then accesses the shared bank 251 to perform the data write operation. After the data write operation, the second processor 230 then releases the token to the first processor 220.

Upon receiving the token, the first processor 220 may then access the shared bank 251. Alternatively or in addition, upon receiving the token, the first processor 220 may copy the data in the shared bank 251 to the first exclusive bank 252 prior to retrieving the data.

As shown in FIG. 4C, alternatively or in addition, the dual-port memory 240 may include a register having flag bits to track the token for the shared bank 251. For example, each of the first and second processors 220 and 230 may check the flag bits to verify possession of the token and to request for the token. In addition, the register may clear the flag bits automatically after the access of the shared bank 251 is completed. In addition, prior to initiating a power-down/sleep operation, the processor 220 or 230 may complete its access to the shared bank 251 before the register clears the flag bits for the token.

Figure 5:
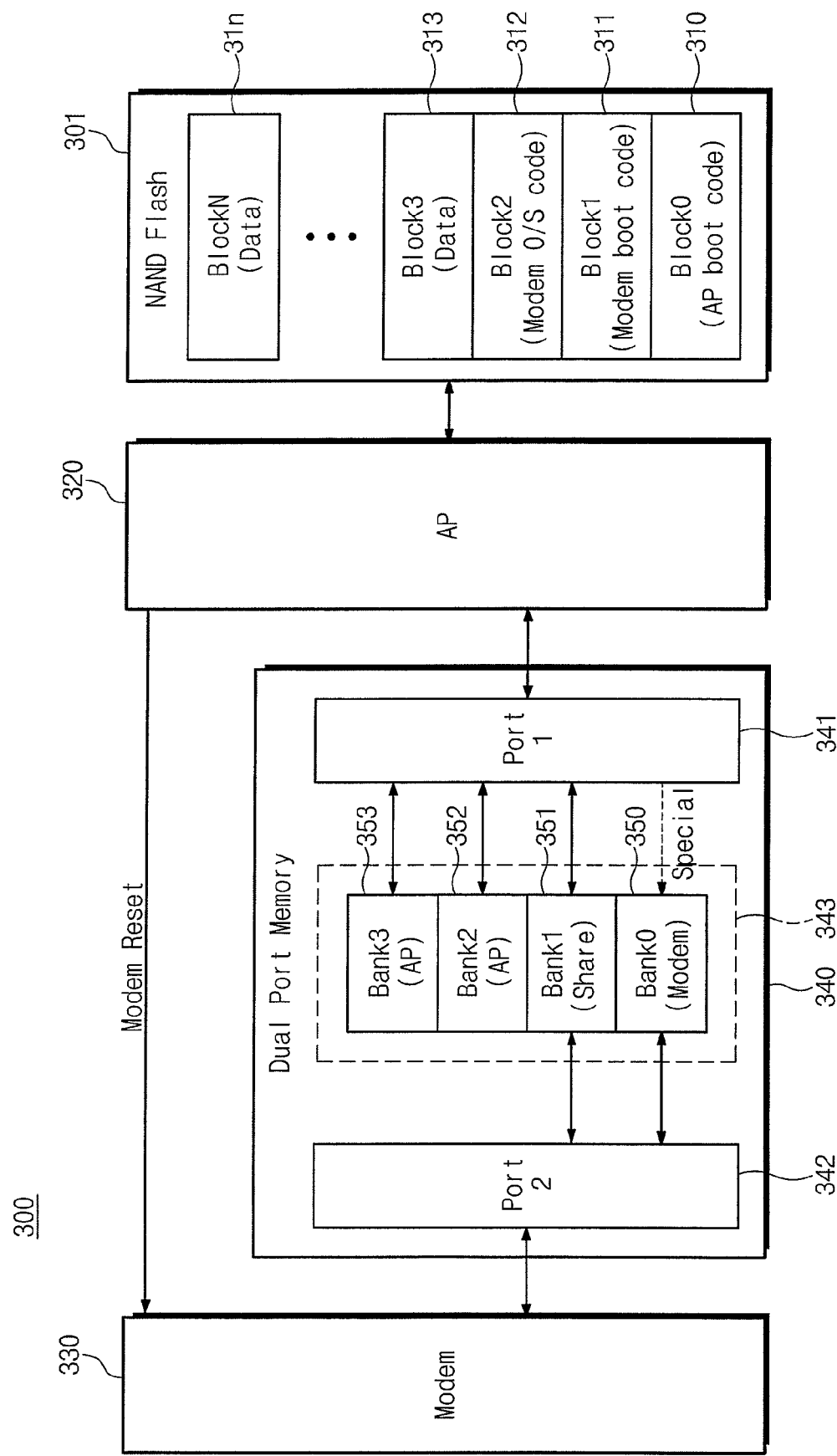
FIG. 5 is a schematic diagram illustrating communication paths of a memory system according to yet another embodiment of the present invention.

FIG. 5 is a schematic diagram illustrating communication paths of a memory system according to yet another embodiment of the present invention. In FIG. 5, the system 300 may include a non-volatile memory 301, a first processor 320, a second processor 330, and a dual-port memory 340. The dual-port memory 340 has the special operational mode as shown in FIG. 2B.

In addition, the non-volatile memory 301 holds system management information including AP boot code, modem boot code and modem O/S code. In particular, memory cells of the non-volatile memory 301 may be organized into a plurality of blocks 310 ... 31n (n being a positive integer), and each of the blocks 310 ... 31n may store respective system management information. For example, the first memory block 310 may store AP boot code, the second memory block 311 may store modem boot code, the third memory block 312 may store the modem O/S code, an a the nth memory block 31n may store system data. The non-volatile memory 301 may be a flash memory.

During a start-up operation of the system 300, the first processor 320 is booted in accordance with the AP boot code stored in the non-volatile memory 301. The AP boot code may be stored in the first memory block 310 of the non-volatile memory 301, and the first processor 320 is booted in accordance with the AP boot code by accessing the first memory block 310.

After the first processor 320 is booted, the first processor 320 retrieves start-up information for the second processor 330. For example, the modem boot code may be stored in the second memory block 311 of the non-volatile memory 301, and the modem O/S code may be stored in the third memory block 312 of the non-volatile memory 301. As such, the first processor 320 accesses the second memory block 311 and the third memory block 312 to retrieve the modem boot code an the modem O/S code. In addition, the first processor 320 stores the retrieved model boot code and the modem O/S code in the dual-port memory 340.

Prior to storing the retrieved modem boot code and the retrieved modem O/S code in the dual-port memory 340, the first processor 320 may initialize the entire dual-port memory 340. Upon initialization, the dual-port memory 340 is set to the special mode. In the normal mode, the access right for each of the banks of the dual-port memory 340 are shown in solid arrows. In addition, the special mode, a normally exclusive bank may be accessed by an additional port.

For example, in the normal mode, the second exclusive bank 350 is assigned to be accessible exclusively via the second port 342, and in the special mode, the second exclusive bank 350 is also accessible via the first port 341 as shown in the dashed arrow. In the special mode, the register of the dual-port memory 340 may forward a special access flag of the second exclusive bank 350 to the first processor 320.

After receiving the special access flag, the first processor 320 holds the special access right for the second exclusive bank 350 and may directly write the retrieved modem boot code and the retrieved modem O/S code in the second exclusive bank 350 via the first port 341. After writing the modem boot code and the modem O/S code in the second exclusive bank 350 by the first processor 320, the first processor 320 releases the special access flag to the dual-port memory 340 and the dual-port memory 340 is set to the normal mode.

In addition, the first processor 320 releases a modem reset signal to the second processor 330. After receiving the modem reset signal, the second processor 330 accesses the second exclusive bank 350 to retrieve the modem boot code and the modem O/S code via the second port 342. Subsequently, the second processor 330 begins to boot in accordance with the modem boot code and the modem O/S code.

In the above embodiments, the boot code and the O/S code for the modem processor (or second processor) may be merged into a boot. And the transfer of the boot code for booting and O/S operation may be completed in a step.

Figure 6:
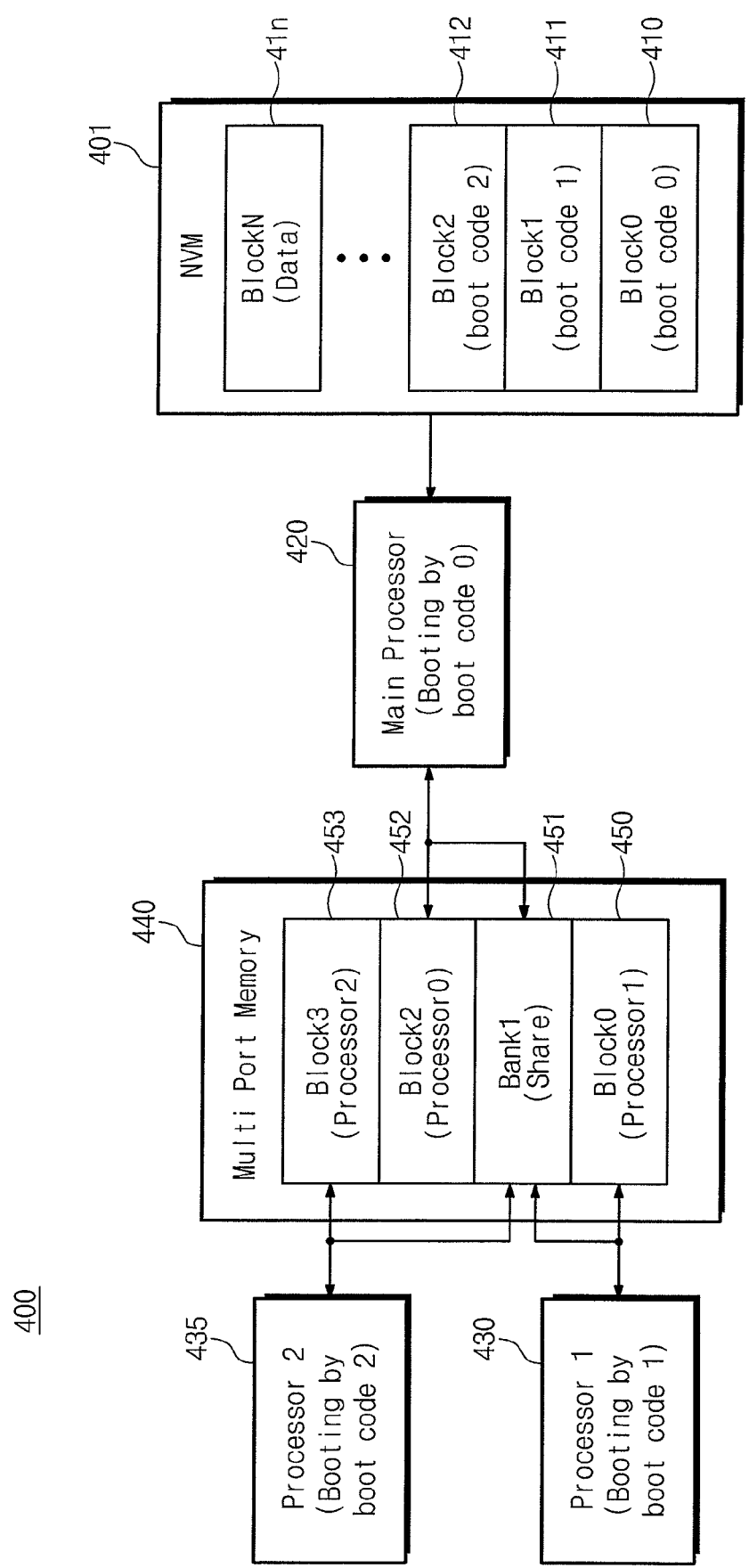
FIG. 6 is a schematic diagram illustrating a memory system according to another embodiment of the present invention.
Figure 7:
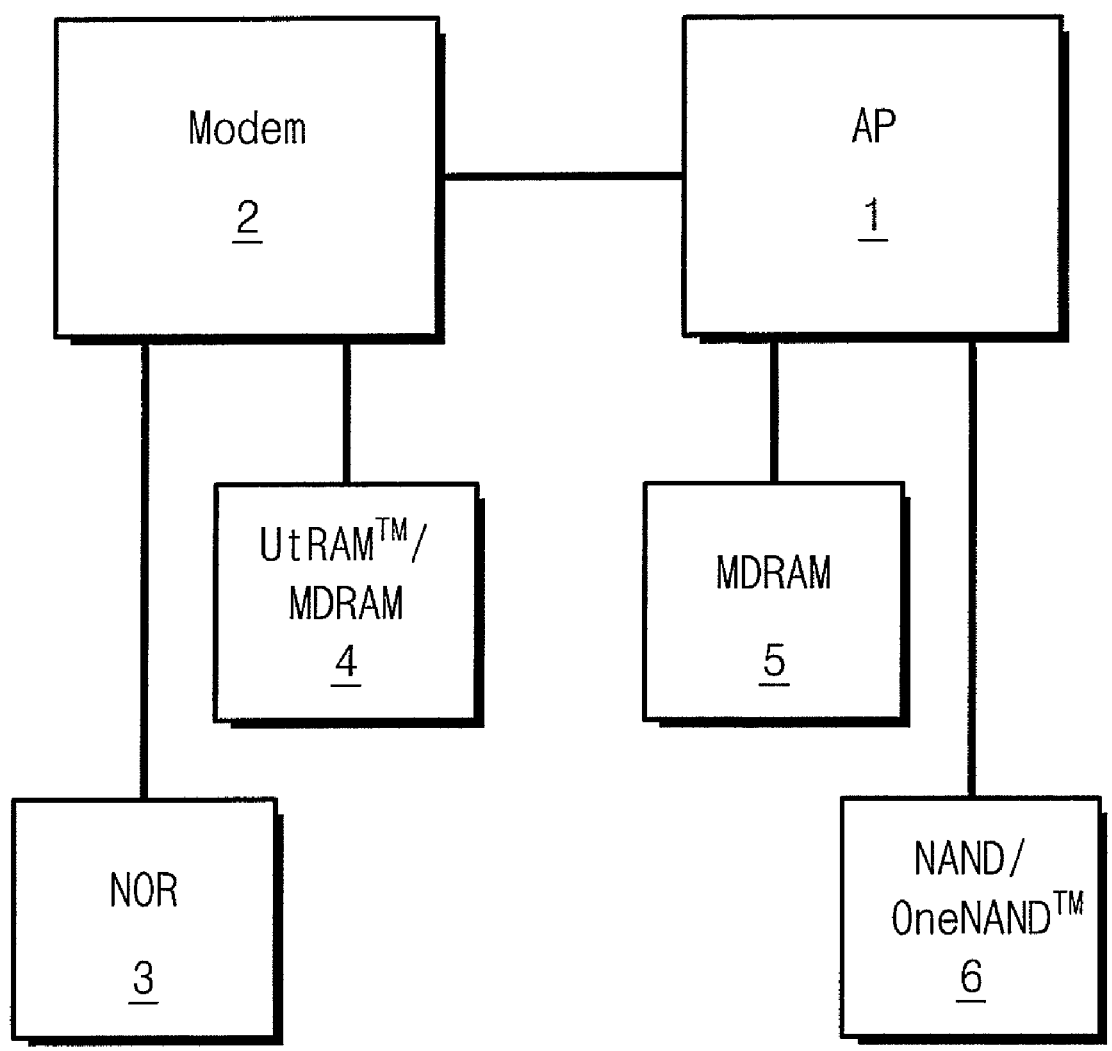
FIG. 7 is a schematic diagram illustrating a multiprocessor system according to the related art.
Figure 8:
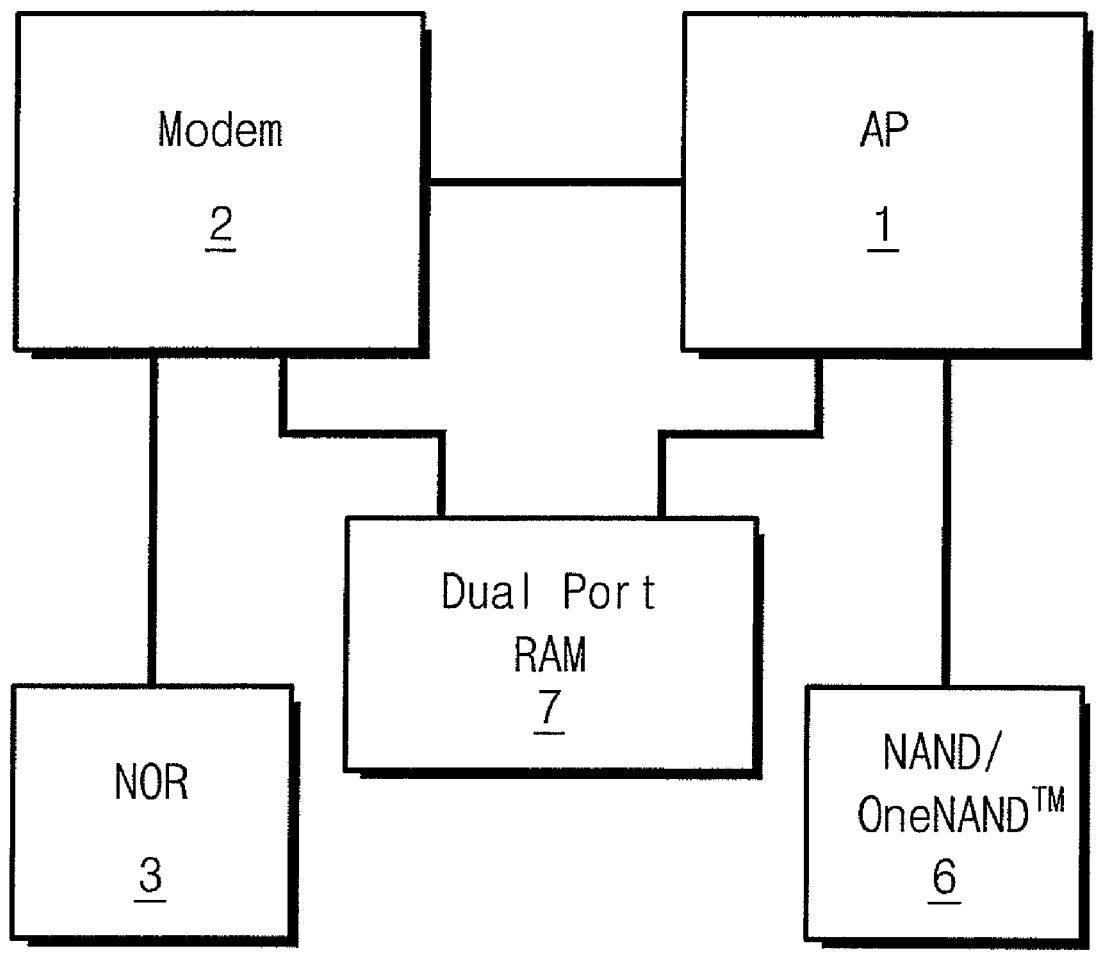
FIG. 8 is a schematic diagram illustrating another multiprocessor system according to the related art.
Figure 9:
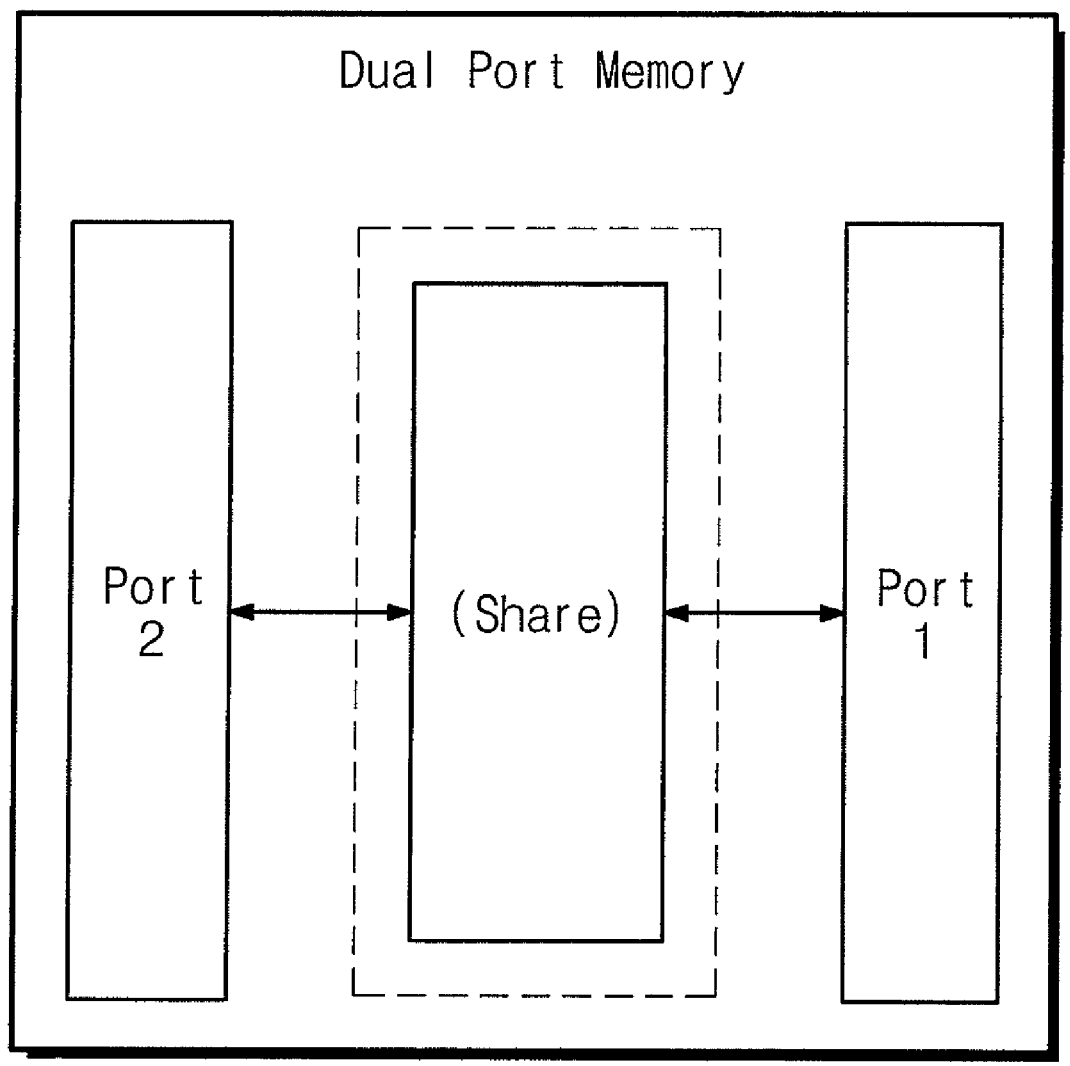
FIG. 9 is a schematic diagram illustrating a dual-port memory shown in FIG. 8.

FIG. 6 is a schematic diagram illustrating communication paths of a memory system according to another embodiment of the present invention. As shown in FIG. 6, the system may include three or more processors. For example, a 3-processor system 400 includes a main processor 420, a first processor 430 and a third processor 435. The system 440 further includes a non-volatile memory 401 for holding system management information and a multi-port memory 440 for providing processing memory space. In particular, memory cells of the non-volatile memory 401 may be organized into a plurality of blocks 410 ... 41n (n being a positive integer), and each of the blocks 410 ... 41n may store respective system management information.

For example, the first memory block 410 may store boot code 0 for booting the main processor 420, the second memory block 411 may store boot code 1 for booting the first processor 430, the third memory block 412 may store boot code 2 for booting the second processor 435, and the nth memory block 41n may store system data. The flash memory 401 may be a flash memory.

In addition, each of the three processors 420, 430 and 435 connects the multi-port memory 440 via separate ports. The multi-port memory 440 includes a plurality of memory spaces organized into a plurality of memory banks, 450, 451, 452 and 453. For example, the first memory bank 450 is assigned to be accessible exclusively by the first processor 430, the second memory bank 451 is assigned to be shared by the processors 420, 430 and 435, the third memory bank 452 is assigned to be accessible exclusively by the main processor 420, and the fourth memory bank 453 is assigned to be accessible exclusively by the second processor 435.

Although not shown, the memories in the systems 100, 200, 300 and 400 may be alternatively arranged as shown in FIG. 1B or FIG. 1C. For example, the non-volatile memory 101 and the dual-port memory 140 shown in FIG. 3 may be integrally formed as a multi-port hybrid chip, may be directly connected to each other, as shown in FIG. 1C, or may be incorporated into a multi-port non-volatile memory, as shown in FIG. 1D. Further, for example, the non-volatile memory 301 and the dual-port memory 340 shown in FIG. 5 may be integrally formed as a multi-port hybrid chip, may be directed connected to each other or may be incorporated into a multi-port non-volatile memory.

In addition, although the dual-port memories 140, 240 and 340 may have more than two ports. Further, the dual-port memories 140, 240 and 240 may be pseudo dual-port memories as shown in FIG. 2C.

Moreover, although the first processors 120, 220 and 320 are shown as application processors in FIGS. 3, 4 and 5, the first processors 120, 220 and 320 may be any suitable microprocessors. Similarly, although the second processors 130, 230 and 330 are shown as modem processors in FIGS. 3, 4 and 5, the second processors 130, 230 and 330 may be any suitable microprocessors.

Figure 10:
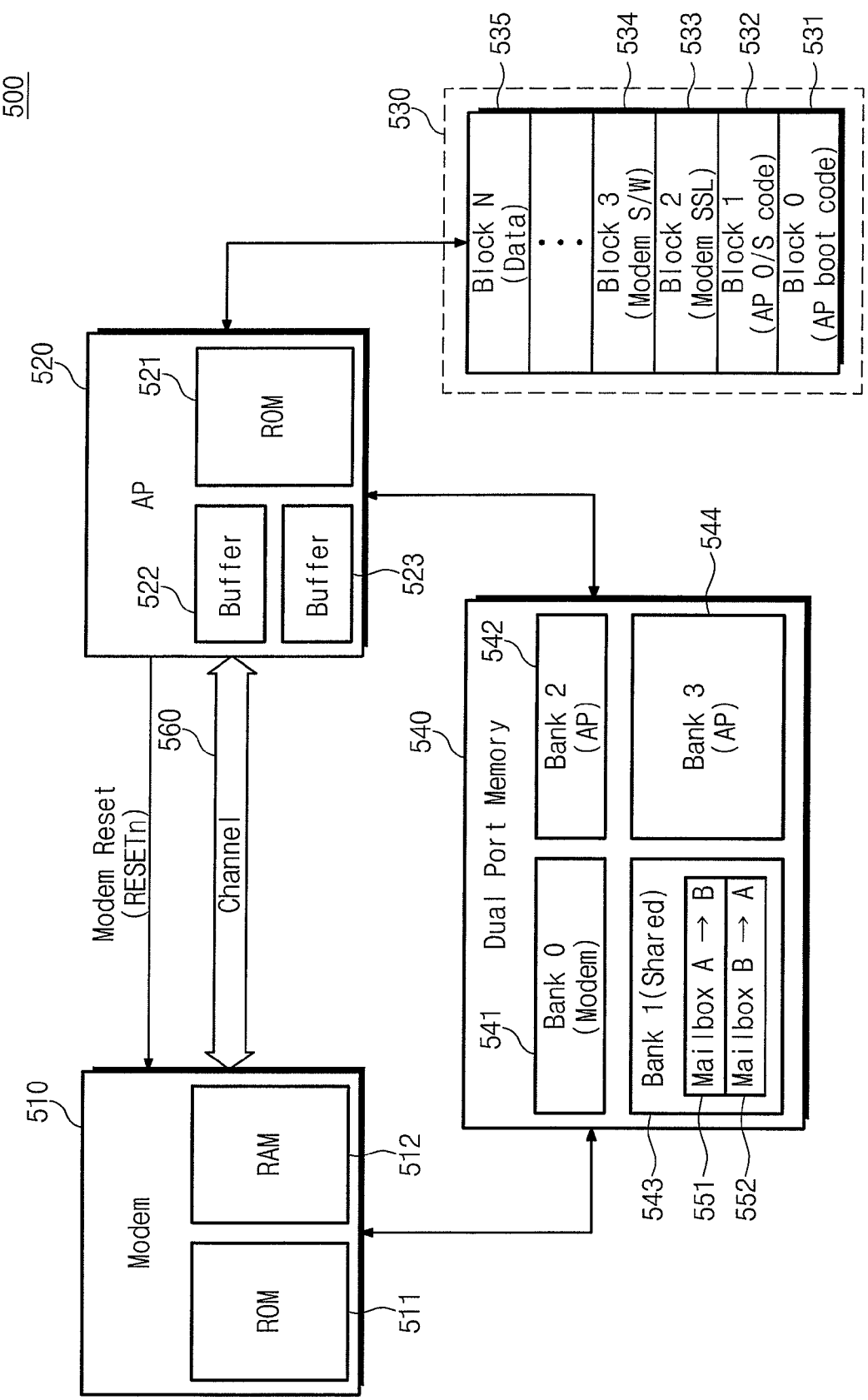
FIG. 10 is a schematic diagram illustrating a digital processing system according to an embodiment of the present invention.

FIG. 10 illustrates a digital processing system 500 according to an exemplary embodiment of the present invention. The digital processing system 500 includes a first processor (Modem) 510, a second processor (AP) 520, a flash memory 530 being a first memory, and a DRAM 540 being a second memory.

The Modem 510 and AP 520 transmit and receive control signals directly and are connected to each other via a universal asynchronous receiver/transmitter (UART), a serial peripheral interface (SPI) or other interfaces. A communication channel 560 adopts one standard interface among SRAM, UART, SPI, or USB interfaces and connects the Modem 510 and AP 520 to each other.

The Modem 510 includes a ROM 511 and a RAM 512. The ROM 511 stores a boot code therein. During power-up, the Modem 510 performs a series of booting steps based on the boot code stored in the ROM 511.

The AP 520 includes a ROM 521 and buffers 522, 523. During power-up, the AP 520 reads and executes a boot code stored in the flash memory 530 based on a boot loader stored in the ROM 521.

The flash memory 530 is connected to the AP 520 and includes a plurality of blocks 531, 532, 533, 534, 535 each storing system management information therein. For example, the memory block 531 stores a boot code for the second processor 530. The memory block 532 stores a system code for the Modem 510. The memory block 533 stores a second stage loader (SSL) for the first processor. The memory block 534 stores program codes needed for the operation of the Modem 510. The memory block 535 stores system data.

The DRAM 540 is a dual-port memory (e.g., in an exemplary embodiment a OneDRAM™ memory manufactured by Samsung Electronics Co., Ltd.) which is concurrently accessible by each of the AP 520 and Modem 510. Although the DRAM 540 shown in FIG. 10 is a dual-port memory, other exemplary embodiments of the present invention may use a multi-port memory having a memory bank allowing access by two or more ports.

In the exemplary embodiment depicted in FIG. 10, the DRAM 540 includes four banks 541, 542, 543, 544. The Bank 0 541 is a first-processor (Modem)-only area which is accessible only by the Modem 510. The Bank 2 542 and Bank 3 544 are a second-processor (AP)-only area which is accessible only by the AP 520. The Bank 1 (Shared) 543 is an area which is accessible by both the AP 520 and Modem 510. Hereinafter, the Bank 1 (Shared) 543 will be referred to as a shared bank.

Although the shared bank 543 may be accessed by both the AP 520 and Modem 510, it may be accessed by only one of the AP 520 and Modem 510 at a specific time. The shared bank 543 includes mailboxes 551, 552 for storing information of an access allowable by one of the AP 520 and Modem 510. The mailboxes 551, 552 may be assigned to a partial area of the shared bank 543. In some embodiments, the mailboxes 551, 552 may be separately provided inside the DRAM 540 as an interface area such as a register or a buffer.

When an access right to the shared bank 543 is transferred to a counterpart processor in a preset transmission direction, messages (right request, data transfer, and command transmission) are delivered to the counterpart processor. The delivered messages are written into the mailboxes 551, 552. For transferring the access right to the shared bank 543 to the AP 520 from the Modem 510, the Modem 510 or the AP 520 writes a message into the mailbox 551.

For example, when the Modem 510 requests an access right to the shared bank 543, it writes a predetermined message into the mailbox 552. The DRAM 540 generates interrupt signals such that the AP 520 executes a predetermined interrupt treatment service, based on the message. These output signals are transmitted to the AP 520 using connected circuits (not shown). The AP 520 executes the predetermined interrupt treatment service and writes an approval signal into the mail box 552. Through the foregoing series of operations, the access right to the shared bank 543 may be transferred to the Modem 510 from the AP 520.

Although only elements associated with a booting operation of the digital processing system 500 are shown in FIG. 10, the digital processing system 500 may further include other elements. In the case where the digital processing system 500 is a mobile phone, the mobile phone may further include a keypad, a display unit, a camera module, an antenna, a speaker and so forth. Moreover, exemplary embodiments of the present invention may be applied to not only a mobile phone but also mobile computing devices or mobile communication devices such as bidirectional radio communication systems, unidirectional pagers, bidirectional pagers, personal communication systems or portable computers.

Figure 11:
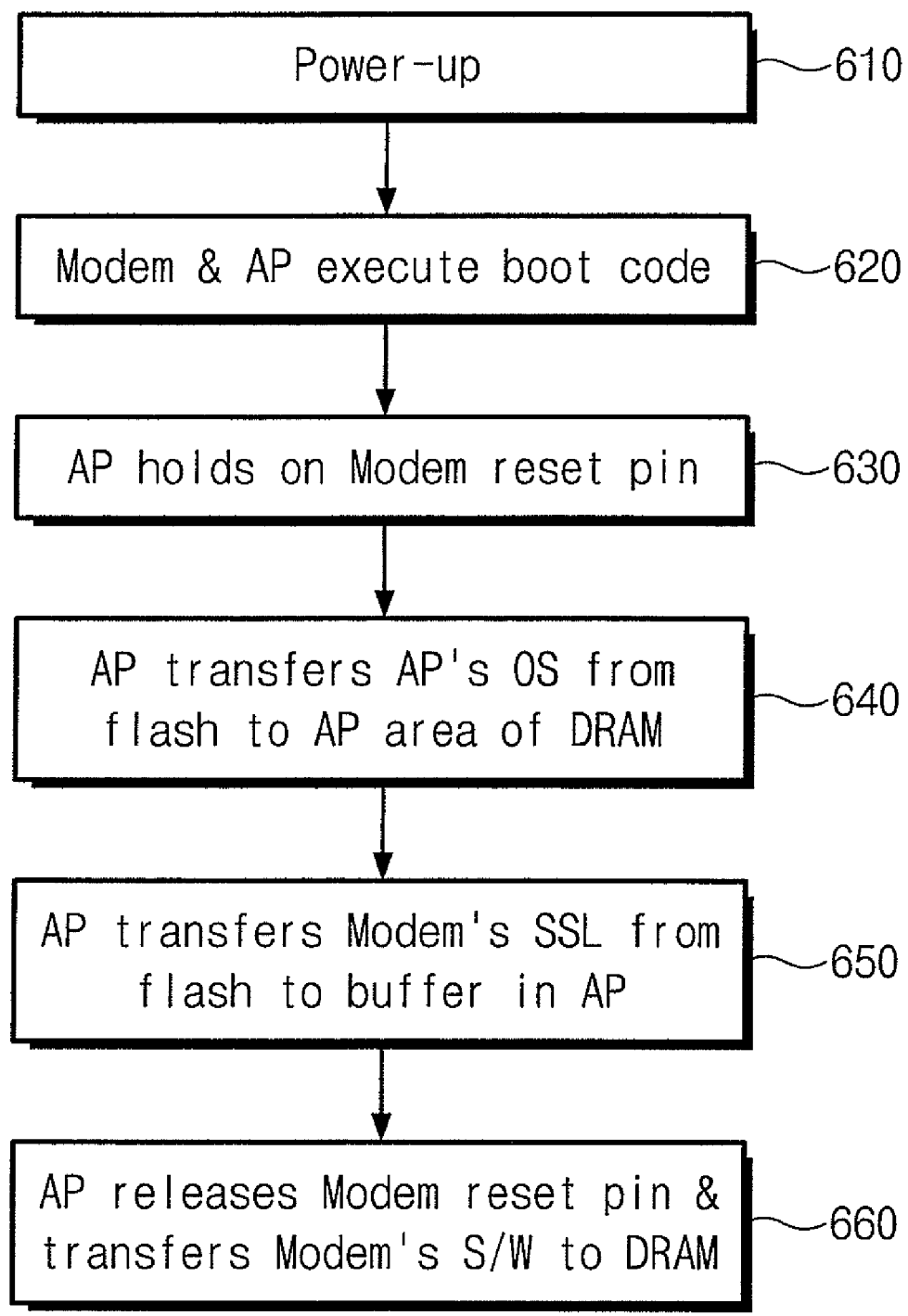
FIG. 11 is a flowchart illustrating the booting steps according to an embodiment of the present invention.

A booting method of the digital processing system 500 will now be described below in more detail. FIG. 11 is a flowchart illustrating the booting steps according to an exemplary embodiment of the present invention.

When power is supplied to the digital processing system 500 (610), the Modem 510 executes a boot code stored in the Modem 510 and the AP 520 executes a boot loader stored in the ROM 521 to load the boot code from the memory block 531 in the flash memory 530 (620). The AP 520 controls a reset terminal (not shown) of the Modem 510 to be maintained at an inactive state (630). That is, the AP 520 deactivates a reset signal RESETn to prevent the Modem 510 from beginning an interface outside the digital process system 500.

The AP 520 reads an O/S of the AP 520 from the memory block 532 of the flash memory 530 and stores the read-out O/S in the second-processor-only bank 542 and/or the bank 544 (640).

The AP 520 reads the second stage loader (SSL) of the Modem 510 from the memory block 533 of the flash memory 530 and stores the read-out SSL in the buffer 522 of the AP 520 (650). The buffer 522 may be a RAM.

The AP 520 transitions the reset terminal of the Modem 510 to an active state, and reads a program code for the Modem 510 from the memory block 534 and stores the read-out program code in the DRAM 540 (660). At this point, the SSL stored in the buffer 522 of the AP 520 is transmitted to the RAM 512 of the Modem 510.

According to the foregoing, during power-up, the program code for the Modem 510 stored in the flash memory 530 is loaded into the DRAM 540 by the AP 520 without the control of the Modem 510. Since the speed of transferring data between the AP 520 and the DRAM 540 is high (e.g., 500 MHz), the program code for the Modem 510 may be loaded fast into the DRAM 540 from the flash memory 530. As a result, booting speed of the digital processing system 500 may be improved.

Figure 12:
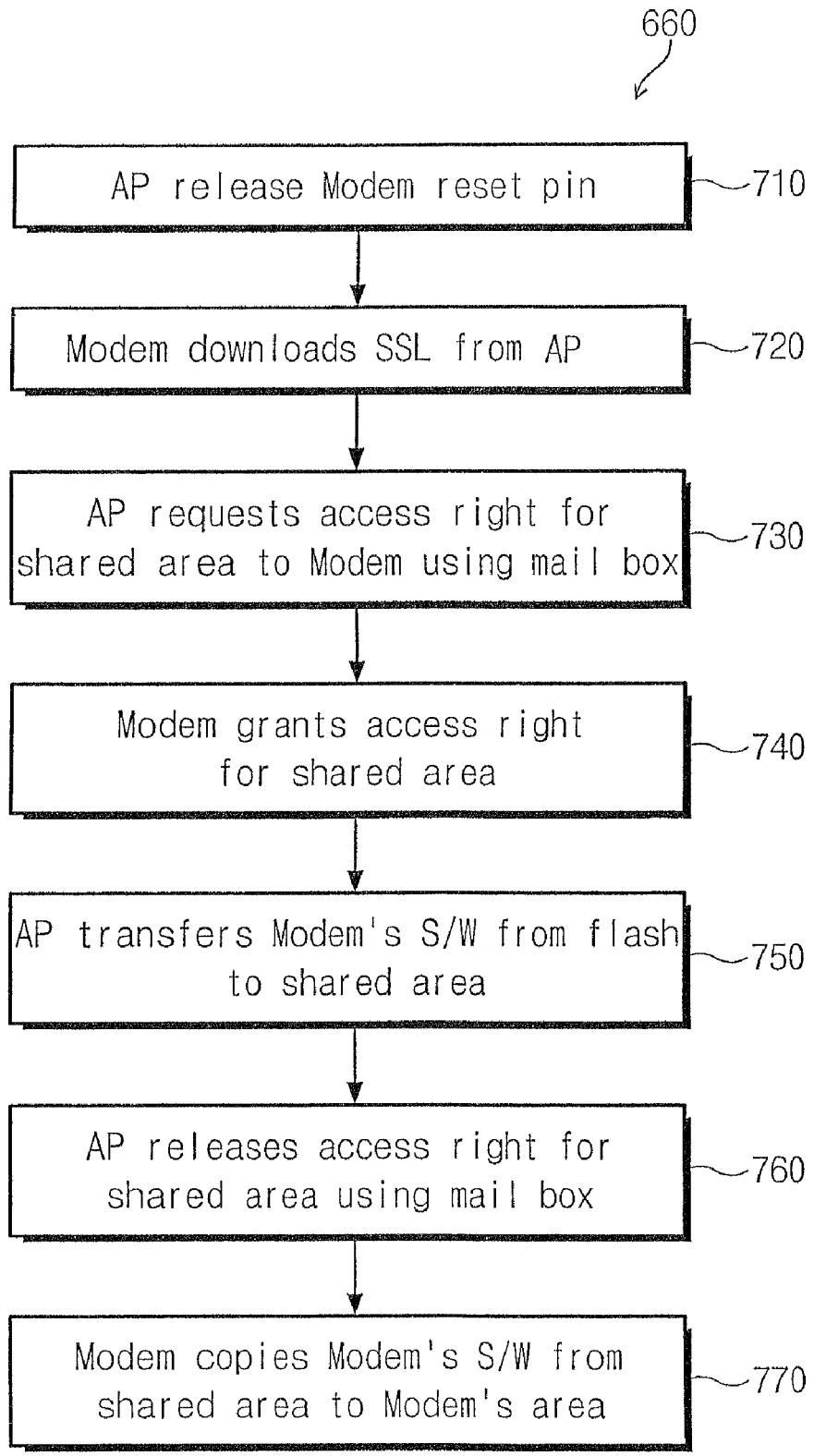
Figure 13:
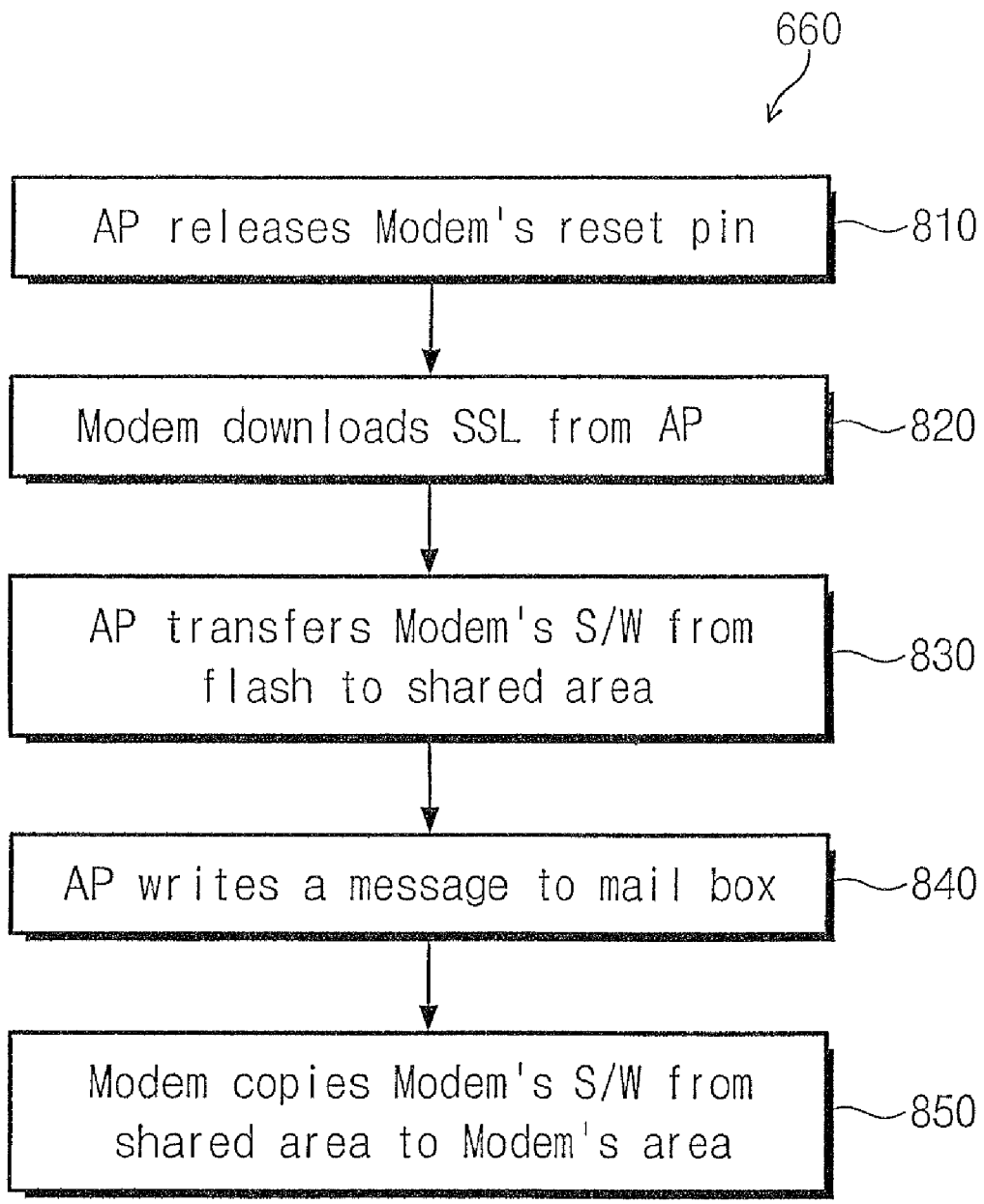

FIGS. 12 to 14 are flowcharts illustrating detailed embodiments of the procedures of transitioning the reset terminal of the Modem 510 to the active state and reading the program code for the Modem 510 from the flash memory 530 and storing the read-out program code in the DRAM 540, which is illustrated in FIG. 11.

The flowchart in FIG. 12 illustrates an operating method when the SSL stored in the RAM 512 of the Modem 510 grants access right to the shared bank 543 to the Modem 510 in the initial stage. The flowcharts in FIGS. 13 and 14 illustrate an operating method when access right to the shared bank 543 is granted to the AP 520 in the initial stage.

Referring to FIG. 12, the Modem 510 transitions the reset terminal of the AP 520 to an active state (710). The Modem 510 downloads the SSL stored in the buffer 520 of the AP 520 into the RAM 512 (720).

In this embodiment, it is assumed that the access right to the shared bank 543 being a shared area is granted to the first processor in the initial stage. The access right to the shared bank 543 is defined by the SSL written into the RAM 512 of the Modem 510.

The AP 520 writes a message into the mailbox 541 of the DRAM 540 to obtain the access right to the shared bank 543 (730). The Modem 510 permits the AP 520 to access to the shared bank 543 (740). The AP 520 reads the program code for the Modem 510 from the memory block 534 of the flash memory 530 and writes the read-out program code into the shared bank 543 (750).

The AP 520 releases the access right to the shared bank 543 to the first processor by writing the message into the mailbox 552 (760). The Modem 510 reads the program code for the Modem 510 stored in the shared bank 543 and stores the read-out program code in the first-processor-only area, i.e., the bank 541 of the DRAM 540.

Through the above steps, the program code for the Modem 510 stored in the flash memory 530 is loaded into the first-processor-only area, i.e., the bank 541. Further, the program code read from the memory block 534 of the flash memory 530 is delivered to the first-processor-only area, i.e., the bank 541 by the Modem 510 after being stored in the shared bank 543 of the DRAM 540 by the control of the AP 520 without passing the interface between the AP 520 and Modem 510. Since the Modem 510 and the DRAM 540 as well as the AP 520 and the DRAM 540 are connected to each other by a high-speed data bus, data transfer speed is high.

The flowchart in FIG. 13 illustrates an exemplary embodiment of the procedures of transitioning the reset terminal of the Modem 510 to the active state and reading the program code for the Modem 510 from the flash memory 530 and storing the read-out program code in the DRAM 540, which is illustrated in FIG. 11.

Referring to FIG. 13, the AP 520 controls the reset terminal of the Modem 510 to be activated. That is, the AP 520 provides an activated reset signal RESETn to the Modem 510 (810).

The Modem 510 downloads the SSL stored in the buffer 522 of the AP 520 into the RAM 512 (820). The Modem 510 operates with the SSL stored in the RAM 512. It is noted that, in this embodiment, the SSL grants the access right to the shared bank 543 to the AP 520 in the initial stage.

The AP 520 reads the program code for the Modem 510 from the memory block 534 of the flash memory 530 and stores the read-out program code in the shared bank 543 (830).

After transmitting the entire program code for the Modem 510 to the shared bank 543, the AP 520 writes a message into the mailbox 552 to release the access right to the shared bank 543 to the Modem 510 from the AP 520 (840).

The Modem 510 reads the program code for the Modem 510 from the shared bank 543 and stores the read-out program code in the first-processor-only area, i.e., the bank 541 (850).

The flowchart in FIG. 14 illustrates an exemplary embodiment of the procedures of transitioning the reset terminal of the Modem 510 to the active state and reading the program code for the Modem 510 from the flash memory 530 and storing the read-out program code in the DRAM 540, which is illustrated in FIG. 11.

In the exemplary embodiment illustrated in FIG. 14, it is assumed that the access right to the shared bank 543 is granted to the AP 520 in the initial stage.

Referring to FIG. 14, the AP 520 reads the program code for the Modem 510 from the memory block 534 of the flash memory 530 and writes the read-out program code into the shared area 543 of the DRAM 540 (910).

After completion of the operation of transferring the entire program code for the Modem 510 to the shared area 543 of the DRAM 540 from the memory block 534 of the flash memory 530, the AP 520 releases access right to the shared banks 541, 543 to the Modem 510 by writing the message into the mailbox 552 (920).

The AP 520 makes the reset terminal of the first processor inactive (930). The Modem 510 downloads the SSL stored in the buffer 522 of the AP 520 and stores the downloaded SSL in the RAM 512 (940). The Modem 510 executes setting of device drivers, based on the SSL stored in the RAM 512. The SSL checks the mailboxes 551, 552 and writes a confirm message into the mailbox 552 to confirm that the access right to the shared bank 543 is released to the Modem 510.

The Modem 510 reads the program code for the Modem 510 stored in the shared bank 543 and stores the first-processor-only area, i.e., the bank 541 (950).

As described above, a first processor program code is downloaded fast into a second memory to decrease booting time of a digital processing system.

It will be apparent to those skilled in the art that various modifications and variations can be made in the memory system and the memory management method including the same of the present invention without departing from the spirit or scope of the invention. Thus, it is intended that the present invention covers the modifications and variations of this invention provided they come within the scope of the appended claims and their equivalents.

What is claimed is:

1. A booting method of a digital processing system having a first processor and a second processor, comprising:
stopping an interface between the first processor and outside of the digital processing system;
transmitting a second processor program code to a second memory from a first memory;
transmitting a second stage loader for the first processor to a buffer of the second processor from the first memory; and
transmitting a first processor program code to the second memory from the first memory under control of the second processor and resuming the interface between the first processor and the outside,
wherein the second stage loader is transferred to the first processor from the buffer of the second processor bypassing the second memory.

2. The booting method of claim 1, wherein the second memory comprises a first memory area, a second memory area and a third memory area.

3. The booting method of claim 2, wherein the second memory is a dual port memory which is accessible to both the first processor and the second processor.

4. The booting method of claim 3, wherein:
the first memory area is an area that is for use only by the first processor,
the second memory area is an area that is for use only by the second memory, and
the third memory area is an area that is shared by the first processor and the second processor.

5. The booting method of claim 4, wherein the second stage loader is configured to grant an access right to the third memory area to the first processor in an initial stage.

6. The booting method of claim 5, further comprising:
resuming the interface between the first processor and the outside under the control of the second processor;
downloading the second stage loader into an internal memory of the first processor from a buffer of the second processor;
requesting the third memory area to be accessed by the second processor;
permitting an access to the third memory area of the second memory by the second processor;
transmitting the first processor program code to the third memory area by the second processor after access to the third memory area is permitted;
granting the access right to the third memory area to the first processor; and
copying the first processor program code stored in the third memory area to the first memory area by the first processor.

7. The booting method of claim 6, wherein the second memory includes a mailbox that receives the access right to the third memory area.

8. The booting method of claim 4, wherein the second stage loader is configured to grant an access right to the third memory area to the second processor in an initial stage.

9. The booting method of claim 8, further comprising:
resuming the interface between the first processor and the outside under the control of the second processor;
downloading the second stage loader into an internal memory of the first processor from a buffer of the second processor;
transmitting the first processor program code to the third memory area by the second processor;
granting the access right to the third memory area to the first processor; and
copying the first processor program code stored in the third memory area to the first memory area by the first processor.

10. The booting method of claim 9, wherein the second memory includes a mailbox that receives an access right to the third memory area.

11. The booting method of claim 4, wherein the access right to the third memory area is granted to the second processor in an initial stage.

12. The booting method of claim 11, further comprising:
transmitting the first processor program code to the third memory area of the second memory from the first memory under control of the second processor;
granting an access right to the third memory area to the first processor;
resuming the interface between the first processor and the outside under control of the second processor;
downloading the second stage loader into an internal memory of the first processor from a buffer of the second processor; and
copying the first processor program code stored in the third area of the second memory to the first area by the first processor.

13. The method of claim 12, wherein the second memory includes a mail box to receive an access right to the second memory area.

14. The method of claim 1, wherein the first memory is a flash memory, and a second memory is a dual port dynamic random access memory.

15. A digital processing system comprising:
a memory;
a first processor;
a second processor coupled to the memory and also coupled to the first processor over a communication channel, the first processor and the second processor both being coupled to a shared memory,
wherein the second processor is configured to:
stop an interface between the first processor and outside of the digital processing system;
transmit a second processor program code to the shared-memory from the memory;
transmit a second stage loader for the first processor to a buffer of the second processor from the first memory; and
transmit a first processor program code to the shared memory from the memory under control of the second processor; and
resume the interface between the first processor and the outside, and
wherein the second stage loader is transferred to the first processor from the buffer of the second processor through the communication channel.

16. The digital processing system of claim 15, wherein:
the first processor is a modem,
the second processor is an application processor,
the memory is a flash memory, and
the shared memory is a dynamic random access memory.

17. The digital processing system of claim 15, wherein:
the second processor program code is operating system code, and
the first processor program code is modem program code.

18. The digital processing system of claim 15, wherein the digital processing system is a mobile phone, a bidirectional radio communication system, a unidirectional pager, a bidirectional pager, a personal communication system or a portable computer.

* * * * *